US006879181B2

(12) United States Patent
Cornelius

(10) Patent No.: US 6,879,181 B2
(45) Date of Patent: Apr. 12, 2005

(54) METHODS AND APPARATUSES FOR SIGNAL LINE TERMINATION

(75) Inventor: William Cornelius, Los Gatos, CA (US)

(73) Assignee: Apple Computer, Inc., Cupertino, CA (US)

( * ) Notice: Subject to any disclaimer, the term of this patent is extended or adjusted under 35 U.S.C. 154(b) by 9 days.

(21) Appl. No.: 10/646,385

(22) Filed: Aug. 21, 2003

(65) Prior Publication Data

US 2004/0113650 A1 Jun. 17, 2004

Related U.S. Application Data

(63) Continuation-in-part of application No. 09/752,508, filed on Dec. 27, 2000, now Pat. No. 6,661,355.

(51) Int. Cl.$^7$ .............................................. H03K 17/16
(52) U.S. Cl. .............................. 326/30; 326/26; 326/82
(58) Field of Search .............................. 326/26, 27, 30, 326/82, 83, 86

(56) References Cited

U.S. PATENT DOCUMENTS

| | | | |
|---|---|---|---|
| 4,573,034 | A | 2/1986 | Schouhamer Immink |
| 5,381,425 | A | 1/1995 | Bitzer et al. |
| 5,504,774 | A | 4/1996 | Takai et al. |
| 5,608,760 | A | 3/1997 | Sandri et al. |
| 5,910,969 | A | 6/1999 | Sayiner et al. |
| 5,938,773 | A | 8/1999 | Hauck et al. |
| 6,094,381 | A | 7/2000 | Isa |
| 6,256,722 | B1 | 7/2001 | Acton et al. |
| 6,265,994 | B1 | 7/2001 | Kahlman |

FOREIGN PATENT DOCUMENTS

GB     2160392     12/1985

OTHER PUBLICATIONS

Mircea R. Stan, et al, Bus Invert Coding for Low–Power I/O, IEEE tranaction on VLSI systems, vol. 3, No. 1, Mar. 1995, pp. 49 and 50.

Kazuyuki Nakamura, et al, "A 50% Noise Reduction Interface using Low Weight Coding", NEC corporation, Shimokuzawa, Sagamihara, Kanagawa 229, Japan, Center for Integrated Systems, Stanford University, Stanford, CA 94305, pp. 144 and 145.

Luca G. Tallini, et al, "Balanced Codes with Parallel Encoding and Decoding", IEEE Transaction on Computers, vol. 48, No. 8, Aug. 1999, pp. 794–814.

Luca G. Tallini, et al, "Design of Balanced and Constant Weight Codes for VLSI Systems", IEEE Transaction on Computers, vol. 47, No. 5, May 1998.

Jeffrey F. Tabor, "Noice Reduction using Low–Weight and Constant Weight Coding Techniques", Massachusetts Institute of Technology, Aug. 10, 1990.

Youngsoo Shin, et al., "Partical Bus–Invert Coding for Power Optimization of System Level Bus", School of Electric Engineering, Seoul National University, Seoul 151–742, Korea, 1998, pp. 127–129.

J. Pieter M. Schalkwuk, "An Algorithm for Source Coding", IEEE Transactions on Information Theory, vol. IT–18, No. 3, May 1972, pp. 395–399.

*Primary Examiner*—Don Le
(74) *Attorney, Agent, or Firm*—Blakely, Sokoloff, Taylor & Zafman LLP

(57) ABSTRACT

Methods and apparatuses for signal line termination with minimum current flowing through a termination node. In one embodiment, a voltage regulator is connected between a termination node and a system potential reference plane, which is typically system ground or Vss, to regulate a terminating potential, which can be used as a reference potential for the input buffers to receive the signals. The voltage regulator continuously adjusts the reference potential that will be used by the signal line input buffers to minimize the current flow into and out of the termination node of the signal lines.

47 Claims, 26 Drawing Sheets

FIG. 3

|  | p=0 | p=1 | p=2 | p=3 | p=4 | p=5 | p=6 | p=7 | p=8 | p=9 | p=10 |
|---|---|---|---|---|---|---|---|---|---|---|---|
| n = 1 | 1. | 1. | | | | | | | | | |
| n = 2 | 1. | 2. | 1. | | | | | | | | |
| n = 3 | 1. | 3. | 3. | 1. | | | | | | | |
| n = 4 | 1. | 4. | 6. | 4. | 1. | | | | | | |
| n = 5 | 1. | 5. | 10. | 10. | 5. | 1. | | | | | |
| n = 6 | 1. | 6. | 15. | 20. | 15. | 6. | 1. | | | | |
| n = 7 | 1. | 7. | 21. | 35. | 35. | 21. | 7. | 1. | | | |
| n = 8 | 1. | 8. | 28. | 56. | 70. | 56. | 28. | 8. | 1. | | |
| n = 9 | 1. | 9. | 36. | 84. | 126. | 126. | 84. | 36. | 9. | 1. | |
| n = 10 | 1. | 10. | 45. | 120. | 210. | 252. | 210. | 120. | 45. | 10. | 1. |

NUMBER OF ENCODED LINES (n)

NUMBER OF ONES (P) IN AN ENCODED WORD

FIG. 4

| ENCODED WORD LENGTH | CODE STATES | INPUT WORD LENGTH | EXTRA LINES |
|---|---|---|---|
| 3 | 2 | 1 | 2 |
| 4 | 6 | 2 | 2 |
| 5 | 10 | 3 | 2 |
| 6 | 20 | 4 | 2 |
| 7 | 35 | 5 | 2 |
| 8 | 70 | 6 | 2 |
| 9 | 126 | 6 | 3 |
| 10 | 252 | 7 | 3 |
| 11 | 462 | 8 | 3 |
| 12 | 924 | 9 | 3 |
| 13 | 1716 | 10 | 3 |
| 14 | 3432 | 11 | 3 |
| 15 | 6435 | 12 | 3 |
| 16 | 12870 | 13 | 3 |
| 17 | 24310 | 14 | 3 |
| 18 | 48620 | 15 | 3 |
| 19 | 92378 | 16 | 3 |
| 20 | 184756 | 17 | 3 |
| 21 | 352716 | 18 | 3 |

DIFFERENTIAL CONNECTIONS (PRIOR ART)

Truth Table for Sub-word a9 Decode

Decode Mux Truth Table Sub-word a 296

| Ea4-0 | Decode Path Mux Control | | | | | Block | Da5 | Da4 | Da3 | Da2 | Da1 | Da0 | |
|---|---|---|---|---|---|---|---|---|---|---|---|---|---|
| | Gas | Has | Fas | Jas | Kas | | | | | | | | |
| 10000 | 1 | 0 | 0 | 0 | 0 | G' | 0 | 0 | 0 | Ea5_ | 0 | 0 | ⎫ |
| 01000 | 1 | 0 | 0 | 0 | 0 | G' | 0 | 0 | 0 | Ea5_ | 0 | 1 | ⎬ 278a |
| 00100 | 1 | 0 | 0 | 0 | 0 | G' | 0 | 0 | 0 | Ea5_ | 1 | 0 | |
| 00010 | 1 | 0 | 0 | 0 | 0 | G' | 0 | 0 | 0 | Ea5_ | 1 | 1 | ⎭ |
| 11101 | 0 | 1 | 0 | 0 | 0 | H' | Ea6_·Ea5_ | 1 | 1 | Ea5_ | 0 | 0 | ⎫ |
| 11011 | 0 | 1 | 0 | 0 | 0 | H' | Ea6_·Ea5_ | 1 | 1 | Ea5_ | 0 | 1 | ⎬ 280a |
| 10111 | 0 | 1 | 0 | 0 | 0 | H' | Ea6_·Ea5_ | 1 | 1 | Ea5_ | 1 | 0 | |
| 01111 | 0 | 1 | 0 | 0 | 0 | H' | Ea6_·Ea5 | 1 | 1 | Ea5 | 1 | 1 | ⎭ |
| 11000 | 0 | 0 | 1 | 0 | 0 | F' | Ea5 | Ea5 | Ea5 | Ea5_ | 0 | 0 | ⎫ |
| 10100 | 0 | 0 | 1 | 0 | 0 | F' | Ea5 | Ea5 | Ea5 | Ea5_ | 0 | 1 | ⎬ 282a |
| 01011 | 0 | 0 | 1 | 0 | 0 | F' | Ea5 | Ea5 | Ea5 | Ea5_ | 1 | 0 | |
| 00111 | 0 | 0 | 1 | 0 | 0 | F' | Ea5 | Ea5 | Ea5 | Ea5_ | 1 | 1 | ⎭ |
| 10010 | 0 | 0 | 0 | 1 | 0 | J' | Ea5·Ea6 | Ea6_·Ea5 | Ea5_ | 0 | 0 | 0 | ⎫ |
| 10001 | 0 | 0 | 0 | 1 | 0 | J' | Ea5·Ea6 | Ea6_·Ea5 | Ea5_ | 0 | 0 | 1 | |
| 01100 | 0 | 0 | 0 | 1 | 0 | J' | Ea5·Ea6 | Ea6_·Ea5 | Ea5_ | 0 | 1 | 0 | |
| 01010 | 0 | 0 | 0 | 1 | 0 | J' | Ea5·Ea6 | Ea6_·Ea5 | Ea5_ | 0 | 1 | 1 | ⎬ 284a |
| 01001 | 0 | 0 | 0 | 1 | 0 | J' | Ea5·Ea6 | Ea6_·Ea5 | Ea5_ | 1 | 0 | 0 | |
| 00110 | 0 | 0 | 0 | 1 | 0 | J' | Ea5·Ea6 | Ea6_·Ea5 | Ea5_ | 1 | 0 | 1 | |
| 00101 | 0 | 0 | 0 | 1 | 0 | J' | Ea5·Ea6 | Ea6_·Ea5 | Ea5_ | 1 | 1 | 0 | |
| 00011 | 0 | 0 | 0 | 1 | 0 | J' | Ea5·Ea6 | Ea6_·Ea5 | Ea5_ | 1 | 1 | 1 | ⎭ |
| 11100 | 0 | 0 | 0 | 0 | 1 | K' | Ea6 xor Ea5 | Ea6_ + Ea5 | Ea5_ | 0 | 0 | 0 | ⎫ |
| 11010 | 0 | 0 | 0 | 0 | 1 | K' | Ea6 xor Ea5 | Ea6_ + Ea5 | Ea5_ | 0 | 0 | 1 | |
| 11001 | 0 | 0 | 0 | 0 | 1 | K' | Ea6 xor Ea5 | Ea6_ + Ea5 | Ea5_ | 0 | 1 | 0 | |
| 10110 | 0 | 0 | 0 | 0 | 1 | K' | Ea6 xor Ea5 | Ea6_ + Ea5 | Ea5_ | 0 | 1 | 1 | ⎬ 286a |
| 10101 | 0 | 0 | 0 | 0 | 1 | K' | Ea6 xor Ea5 | Ea6_ + Ea5 | Ea5_ | 1 | 0 | 0 | |
| 10011 | 0 | 0 | 0 | 0 | 1 | K' | Ea6 xor Ea5 | Ea6_ + Ea5 | Ea5_ | 1 | 0 | 1 | |
| 01110 | 0 | 0 | 0 | 0 | 1 | K' | Ea6 xor Ea5 | Ea6_ + Ea5 | Ea5_ | 1 | 1 | 0 | |
| 01101 | 0 | 0 | 0 | 0 | 1 | K' | Ea6 xor Ea5 | Ea6_ + Ea5 | Ea5_ | 1 | 1 | 1 | ⎭ |

Post Inversion Logic

Invert Results of sub-word a decode if W5subCh_c = 1

Invert decoded value for sub-word a if
the weight of sub-word c equals 5

| Decode Mux Truth Table Sub-word b | | | | | | | | | | | | |
|---|---|---|---|---|---|---|---|---|---|---|---|---|
| | Decode Path Mux Control | | | | | | | | | | | |
| Eb4-0 | Gbs | Hbs | Fbs | Jbs | Kbs | Block | Db5 | Db4 | Db3 | Db2 | Db1 | Db0 |
| 10000 | 1 | 0 | 0 | 0 | 0 | G' | 0 | 0 | 0 | 0 | 0 | 0 |
| 01000 | 1 | 0 | 0 | 0 | 0 | G' | 0 | 0 | 0 | 0 | 0 | 1 |
| 00100 | 1 | 0 | 0 | 0 | 0 | G' | 0 | 0 | 0 | 0 | 1 | 0 |
| 00010 | 1 | 0 | 0 | 0 | 0 | G' | 0 | 0 | 0 | 0 | 1 | 1 |
| 11101 | 0 | 1 | 0 | 0 | 0 | H' | 1 | 1 | 1 | 1 | 0 | 0 |
| 11011 | 0 | 1 | 0 | 0 | 0 | H' | 1 | 1 | 1 | 1 | 0 | 1 |
| 10111 | 0 | 1 | 0 | 0 | 0 | H' | 1 | 1 | 1 | 1 | 1 | 0 |
| 01111 | 0 | 1 | 0 | 0 | 0 | H' | 1 | 1 | 1 | 1 | 1 | 1 |
| 11000 | 0 | 0 | 1 | 0 | 0 | F' | Eb5 | Eb5 | Eb5 | Eb5_ | 0 | 0 |
| 10100 | 0 | 0 | 1 | 0 | 0 | F' | Eb5 | Eb5 | Eb5 | Eb5_ | 0 | 1 |
| 01011 | 0 | 0 | 1 | 0 | 0 | F' | Eb5 | Eb5 | Eb5 | Eb5_ | 1 | 0 |
| 00111 | 0 | 0 | 1 | 0 | 0 | F' | Eb5 | Eb5 | Eb5 | Eb5_ | 1 | 1 |
| 10010 | 0 | 0 | 0 | 1 | 0 | J' | Eb5·Eb6 | Eb6_ | Eb5_ | 0 | 0 | 0 |
| 10001 | 0 | 0 | 0 | 1 | 0 | J' | Eb5·Eb6 | Eb6_ | Eb5_ | 0 | 0 | 1 |
| 01100 | 0 | 0 | 0 | 1 | 0 | J' | Eb5·Eb6 | Eb6_ | Eb5_ | 0 | 1 | 0 |
| 01010 | 0 | 0 | 0 | 1 | 0 | J' | Eb5·Eb6 | Eb6_ | Eb5_ | 0 | 1 | 1 |
| 01001 | 0 | 0 | 0 | 1 | 0 | J' | Eb5·Eb6 | Eb6_ | Eb5_ | 1 | 0 | 0 |
| 00110 | 0 | 0 | 0 | 1 | 0 | J' | Eb5·Eb6 | Eb6_ | Eb5_ | 1 | 0 | 1 |
| 00101 | 0 | 0 | 0 | 1 | 0 | J' | Eb5·Eb6 | Eb6_ | Eb5_ | 1 | 1 | 0 |
| 00011 | 0 | 0 | 0 | 1 | 0 | J' | Eb5·Eb6 | Eb6 | Eb5 | 1 | 1 | 1 |
| 11100 | 0 | 0 | 0 | 0 | 1 | K' | Eb6 + Eb5 | Eb6_ | Eb5_ | 0 | 0 | 0 |
| 11010 | 0 | 0 | 0 | 0 | 1 | K' | Eb6 + Eb5 | Eb6_ | Eb5_ | 0 | 0 | 1 |
| 11001 | 0 | 0 | 0 | 0 | 1 | K' | Eb6 + Eb5 | Eb6_ | Eb5_ | 0 | 1 | 0 |
| 10110 | 0 | 0 | 0 | 0 | 1 | K' | Eb6 + Eb5 | Eb6_ | Eb5_ | 0 | 1 | 1 |
| 10101 | 0 | 0 | 0 | 0 | 1 | K' | Eb6 + Eb5 | Eb6_ | Eb5_ | 1 | 0 | 0 |
| 10011 | 0 | 0 | 0 | 0 | 1 | K' | Eb6 + Eb5 | Eb6_ | Eb5_ | 1 | 0 | 1 |
| 01110 | 0 | 0 | 0 | 0 | 1 | K' | Eb6 + Eb5 | Eb6_ | Eb5_ | 1 | 1 | 0 |
| 01101 | 0 | 0 | 0 | 0 | 1 | K' | Eb6 + Eb5 | Eb6 | Eb5 | 1 | 1 | 1 |

Post Inversion Logic

Invert Results of sub-word _b decode if W5subCh_c + W2subCh_a = 1
W5subCh_c = Kcs·Ec6·Ec5 + Hcs·(Ec6 + Ec5)
W2subCh_a = Jas·Ea6_·Ea5_ + Gas·(Ea6_ + Ea5_)

298

Invert decoded value for sub-word b if the weight of sub-word c = 5 and/or the weight of sub-word a = 2

| Decode Mux Truth Table Sub-word c | | | | | | | | | | | | |
|---|---|---|---|---|---|---|---|---|---|---|---|---|
| | Decode Path Mux Control | | | | | Block | Dc5 | Oc4 | Dc3 | Dc2 | Dc1 | Dc0 |
| Ec4-0 | Gcs | Hcs | Fcs | Jcs | Kcs | | | | | | | |
| 10000 | 1 | 0 | 0 | 0 | 0 | G' | Ec6_+Ec5_ | 0 | 0 | Ec5_ | 0 | 0 |
| 01000 | 1 | 0 | 0 | 0 | 0 | G' | Ec6_+Ec5_ | 0 | 0 | Ec5_ | 0 | 1 |
| 00100 | 1 | 0 | 0 | 0 | 0 | G' | Ec6_+Ec5_ | 0 | 0 | Ec5_ | 1 | 0 |
| 00010 | 1 | 0 | 0 | 0 | 0 | G' | Ec6_+Ec5_ | 0 | 0 | Ec5_ | 1 | 1 |
| 11101 | 0 | 1 | 0 | 0 | 0 | H' | 1 | 1 | 1 | Ec5_ | 0 | 0 |
| 11011 | 0 | 1 | 0 | 0 | 0 | H' | 1 | 1 | 1 | Ec5_ | 0 | 1 |
| 10111 | 0 | 1 | 0 | 0 | 0 | H' | 1 | 1 | 1 | Ec5_ | 1 | 0 |
| 01111 | 0 | 1 | 0 | 0 | 0 | H' | 1 | 1 | 1 | Ec5_ | 1 | 1 |
| 11000 | 0 | 0 | 1 | 0 | 0 | F' | Ec5 | Ec5 | Ec5 | Ec5_ | 0 | 0 |
| 10100 | 0 | 0 | 1 | 0 | 0 | F' | Ec5 | Ec5 | Ec5 | Ec5_ | 0 | 1 |
| 01011 | 0 | 0 | 1 | 0 | 0 | F' | Ec5 | Ec5 | Ec5 | Ec5_ | 1 | 0 |
| 00111 | 0 | 0 | 1 | 0 | 0 | F' | Ec5 | Ec5 | Ec5 | Ec5_ | 1 | 1 |
| 10010 | 0 | 0 | 0 | 1 | 0 | J' | (Ec5 xor Ec6)_ | Ec6_ · Ec5 | Ec5_ | 0 | 0 | 0 |
| 10001 | 0 | 0 | 0 | 1 | 0 | J' | (Ec5 xor Ec6)_ | Ec6_ · Ec5 | Ec5_ | 0 | 0 | 1 |
| 01100 | 0 | 0 | 0 | 1 | 0 | J' | (Ec5 xor Ec6)_ | Ec6_ · Ec5 | Ec5_ | 0 | 1 | 0 |
| 01010 | 0 | 0 | 0 | 1 | 0 | J' | (Ec5 xor Ec6)_ | Ec6_ · Ec5 | Ec5_ | 0 | 1 | 1 |
| 01001 | 0 | 0 | 0 | 1 | 0 | J' | (Ec5 xor Ec6)_ | Ec6_ · Ec5 | Ec5_ | 1 | 0 | 0 |
| 00110 | 0 | 0 | 0 | 1 | 0 | J' | (Ec5 xor Ec6)_ | Ec6_ · Ec5 | Ec5_ | 1 | 0 | 1 |
| 00101 | 0 | 0 | 0 | 1 | 0 | J' | (Ec5 xor Ec6)_ | Ec6_ · Ec5 | Ec5_ | 1 | 1 | 0 |
| 00011 | 0 | 0 | 0 | 1 | 0 | J' | (Ec5 xor Ec6)_ | Ec6_ · Ec5 | Ec5_ | 1 | 1 | 1 |
| 11100 | 0 | 0 | 0 | 0 | 1 | K' | Ec6 + Ec5 | Ec6_ + Ec5 | Ec5_ | 0 | 0 | 0 |
| 11010 | 0 | 0 | 0 | 0 | 1 | K' | Ec6 + Ec5 | Ec6_ + Ec5 | Ec5_ | 0 | 0 | 1 |
| 11001 | 0 | 0 | 0 | 0 | 1 | K' | Ec6 + Ec5 | Ec6_ + Ec5 | Ec5_ | 0 | 1 | 0 |
| 10110 | 0 | 0 | 0 | 0 | 1 | K' | Ec6 + Ec5 | Ec6_ + Ec5 | Ec5_ | 0 | 1 | 1 |
| 10101 | 0 | 0 | 0 | 0 | 1 | K' | Ec6 + Ec5 | Ec6_ + Ec5 | Ec5_ | 1 | 0 | 0 |
| 10011 | 0 | 0 | 0 | 0 | 1 | K' | Ec6 + Ec5 | Ec6_ + Ec5 | Ec5_ | 1 | 0 | 1 |
| 01110 | 0 | 0 | 0 | 0 | 1 | K' | Ec6 + Ec5 | Ec6_ + Ec5 | Ec5_ | 1 | 1 | 0 |
| 01101 | 0 | 0 | 0 | 0 | 1 | K' | Ec6 + Ec5 | Ec6_ + Ec5 | Ec5_ | 1 | 1 | 1 |

278c, 280c, 282c, 284c, 286c

Post Inversion Logic

Invert Results of sub-word b decode if W2subCh_a = 1

W2subCh_a = Jas·Ea6_·Ea5_ + Gas·(Ea6_ + Ea5_)

Invert decoded value for sub-word c if the weight of sub-word a = 2

(4B/6L EXAMPLE)
CORRESPONDENCE BETWEEN
DECIMAL, BINARY, AND ENCODED VALUES

| 304 | 306 | 308 |
|---|---|---|
| DECIMAL VALUE | BINARY VALUE | ENCODED VALUE |
| DECIMAL COUNT | BINARY COUNT | BINOMIAL COUNT |
| 0 | 0000 | 000111 |
| 1 | 0001 | 001011 |
| 2 | 0010 | 001101 |
| 3 | 0011 | 001110 |
| 4 | 0100 | 010011 |
| 5 | 0101 | 010101 |
| 6 | 0110 | 010110 |
| 7 | 0111 | 011001 |
| 8 | 1000 | 011010 |
| 9 | 1001 | 011100 |
| 10 | 1010 | 100011 |
| 11 | 1011 | 100101 |
| 12 | 1100 | 100110 |
| 13 | 1101 | 101001 |
| 14 | 1110 | 101010 |
| 15 | 1111 | 101100 |
| 16 | EXTRA | 110001 |
| 17 | EXTRA | 110010 |
| 18 | EXTRA | 110100 |
| 19 | EXTRA | 111000 |

FIG. 22

METHODS AND APPARATUSES FOR SIGNAL LINE TERMINATION

This application is a continuation-in-part (CIP) application of a U.S. patent application Ser. No. 09/752,508, filed Dec. 27, 2000 U.S. Pat. No. 6,661,355, entitled "Method and Apparatus for Constant-Weight Encoding & Decoding".

FIELD OF THE TECHNOLOGY

The present invention relates to the field of information transmission systems. More particularly, in one implementation, the present invention relates to constant-weight encoding and decoding of data words on a parallel data line bus.

BACKGROUND

It is often desirable, in information transmission systems, to transform information into alternate forms. In one instance, a desirable form might be to encode data, to achieve a constant weight code, where each data word contained a constant number of data elements in each logic state. The data words could be binary words occupying two logic states, those of zero and one. This transformation enables the higher supply potential, Vdd, and the lower supply potential, Vss, to maintain constant current to the circuits that drive the signal lines and or constant current in the termination circuit, Vterm. In another instance it may be desirable to spread information from a data word into sub-words and the weight of the sub-words, where the weight of the sub-word is defined to be the number of data elements in each logic state. In a binary system the weight is the number of ones or zeros in a data word. In another instance it may be desirable to minimize the weight so that the power required to drive the parallel data line bus is minimized.

Transmission of N-ary data, where there are more than the traditional two logic states of zero and one, does not impose the same constant weight criterion that is imposed on binary data in order to achieve the constant current conditions mentioned above. There are many combinations of N-ary weight vectors that provide the desired constant current state.

Transmission of binary information on a parallel line bus requires the transmission of data words whose weight ranges from zero to the number of bits in the information word. Therefore, an eight-bit data word has a weight that ranges between zero and eight. Transmission of variable weight data presents problems to interconnect circuits, such as those used in a high-speed bus interface.

In a single-ended parallel interface with line drivers, transmission of variable weight data creates a data-dependent current flow in the Vdd and Vss connections. This data-dependent current flow leads to timing losses. Vdd and Vss interconnect path inductances (L) exist between the voltage sources and the line driver higher and lower potential bias nodes, respectively. A changing current in this inductance path (di/dt) creates voltage variation according to v=Ldi/dt. These voltage changes compromise the integrity of the output signals as a function of data word value. Specifically, they delay high to low and low to high transitions of the signal lines (edges) and create uncertainty in edge location. Both of these effects compromise achievable system speeds. The larger Ldi/dt the greater the degree of the timing loss. If all lines change at once, or if more lines are present di/dt is increased.

Path inductances (L) due to controllable design parameters are already at practical minimal limits. Differential architecture eliminates timing losses due to Vdd and Vss fluctuations, however, this comes at the expense of two lines per bit of information transmitted. It is desirable to obtain differential performance from single-ended architecture. Accordingly, constant-weight parallel encoding has been employed.

Constant-weight parallel encoding can achieve constant Vdd and Vss current flow at the expense of a slight increase in the bus line count. It is possible to achieve many of the benefits of a differential system with only a small increase in lines over single-ended architecture. We will define constant weight parallel encoding to be the result of encoding a data word into an encoded data word with a constant number of data elements in each logic state independent of the input data word value. We further define balanced encoding to be constant-weight parallel encoding such that the number of data elements in each logic state is the same. Thus, a balanced 22-bit encoded data word would have 11 data element whose value was zero and 11 data elements whose value was one. An almost balanced parallel-encoded data word would be closer to the balanced case than the unbalanced case.

As the data word length increases, the complexity of the encode process greatly increases the corresponding time to encode. To employ constant weight parallel encoding in a data transmission system, without compromising performance, requires efficient low latency coding methods. Design of efficient, low latency encoding/decoding methods has been an area of research for the past four decades. Attempts at solving this problem exist in the prior art.

Tallini, G., et. al., "Design of Balanced and Constant Weight Codes for VLSI Systems," IEEE, vol. 47 no. 5, Transactions on Computers May (1998) describes encoding techniques applied to the input word as a whole without partitioning the input word into sub-words. Computation time to encode over an entire word is much greater than the computation time to encode a sub-word, such undivided approaches result in high complexity encode functions. These techniques remain complex and are not easily reduced to low latency implementations on an integrated circuit chip. Burleson, W., et. al., "Bus-Invert Coding for Low-Power I/O," IEEE, vol. 3, no. 1, Transactions on Very Large Scale Integrations (VLSI) Systems March (1995) describes an inversion method for encoding that divides the input word up into sub-words and then proceeds to encode the sub-words to minimize the variability in the weight. Tabor, J., "Noise Reduction Using Low Weight And Constant Weight Coding Techniques," MS Thesis, Artificial Intelligence Lab, MIT, May (1990) also describes dividing the input word into sub-words, but does not achieve constant weight encoding.

The prior-art techniques provide limited simplification of the problem. The prior-art techniques do not provide for sharing of information between sub-words or sub-word paths. Thus, it is desirable to provide efficient, low latency, encoding/decoding methodology that can be implemented with a minimum number of extra lines and encode/decode logic by sharing information between sub-words or sub-word paths to facilitate spreading information into the encoded sub-words as well as into the weight of the encoded sub-words.

SUMMARY OF THE DESCRIPTION

Methods and apparatuses for signal line termination with minimum current flowing through a termination node. Some of the embodiments of the present invention are summarized in this section.

In one embodiment, a voltage regulator is connected between a termination node and a system potential reference plane, which is typically system ground or Vss, to regulate a terminating potential, which can be used as a reference potential for the input buffers to receive the signals. The voltage regulator continuously adjusts the reference potential that will be used by the signal line input buffers to minimize the current flow into and out of the termination node of the signal lines.

In one aspect of the present invention, a method for signal line termination includes: sensing a current flowing through a termination node which terminates a plurality of signal lines; and adjusting a voltage at the termination node to reduce a magnitude of the current. In one example, a voltage regulator adjusts the voltage based on the current that is sensed; the voltage regulator increases the voltage when the current is flowing out of the termination node from the signal lines; and, the voltage regulator decreases the voltage when the current is flowing into the termination node into the signal lines. In one example, signals transmitted on the plurality of signal lines are substantially balanced. In one example, the plurality of signal lines comprises a pair of differential signals. In one example, an average of less than two lines are used to transmit each bit of information in the plurality of signal lines. In one example, the current results from terminating a first signal line carrying a balanced signal and a second signal line carrying a compliment of the balanced signal. In one example, the magnitude of the current is reduced to a level that is substantially zero. In one example, a high frequency component is filtered on the termination node; and, the high frequency component is filtered relative to ground. In one example, the voltage at the termination node provides a reference to each of a plurality of buffers to receive the plurality of signals respectively.

The present invention further includes methods for spreading and concentrating information into encoded data sub-words and the weight of the encoded data sub-words. An embodiment of the present invention is directed to efficient apparatus and methods for constant-weight encoding of data that can be implemented with low latency in a data transmission system. Various embodiments of the present invention are described below.

A method including dividing a data word into data sub-words onto sub-word paths; allowing communication between the sub-word paths; and encoding the data sub-words into encoded data sub-words; such that the information content of the data word is spread between the encoded data sub-words and the weight of the encoded data sub-words.

Another method includes: allowing communication between sub-word paths; and decoding encoded data sub-words into data sub-words; such that the data sub-words form a data word whereby the information content of the data word is concentrated back into the data word.

A preferred embodiment, of the present invention, includes a method of encoding a data word, whose data elements occupy at least a first logic state and a second logic state, the method includes: receiving data sub-words onto sub-word paths, the data sub-words comprising sets of data elements of the data word; and encoding the data sub-words into encoded data sub-words; such that the encoded data sub-words form an encoded data word wherein the information content of the data word is spread between the encoded data sub-words and the weight of the encoded data sub-words.

Another embodiment, of the present invention, includes an encoder module, to encode a data word, whose data elements occupy at least a first logic state and a second logic state, the encoder module includes: at least two sub-word paths, each of the at least two sub-word paths to receive a data sub-word, including a set of data elements of the data word; and an encoder coupled with the at least two sub-word paths, the encoder to encode the data sub-word into an encoded data sub-word; such that encoded data sub-words form an encoded data word wherein the information content of the data word is spread between the encoded data sub-words and the weight of the encoded data sub-words.

In another embodiment, the present invention provides a decoder module to decode an encoded data word, whose encoded data elements occupy at least a first logic state and a second logic state, the decoder module includes: at least two sub-word paths, each of said at least two sub-word paths to receive an encoded data sub-word, including a set of data elements of the encoded data word and to allow communication, between said at least two sub-word paths, such that information may be shared between the at least two sub-word paths; and a decoder coupled with the at least two sub-word paths, the decoder to decode the encoded data sub-word into a data sub-word; such that data sub-words form a data word.

Yet another embodiment, of the present invention, includes a method of decoding an encoded data word, whose encoded data elements occupy at least a first logic state and a second logic state, the method includes: receiving encoded data sub-words onto sub-word paths, the encoded data sub-words including sets of data elements of the encoded data word; allowing communication between the sub-word paths, such that information may be shared between the sub-word paths; and decoding the encoded data sub-words into data sub-words; such that the data sub-words form a data word.

Another preferred embodiment, of the present invention, is a data processing system including: at least two sub-word paths, each of said at least two sub-word paths to receive a data sub-word, comprising a set of data elements of a data word; an encoder coupled with the at least two sub-word paths, the encoder to encode the data sub-word into an encoded data sub-word; such that encoded data sub-words form an encoded data word wherein the information content of the data word is spread between the encoded data sub-words and the weight of the encoded data sub-words; a parallel encoded data line bus coupled with the at least two sub-word paths to receive the encoded data sub-words and to facilitate transmission of the encoded data sub-words; at least two sub-word paths coupled with the parallel encoded data line bus, each of the at least two sub-word paths to receive an encoded data sub-word, including a set of data elements of the encoded data word and allowing communication, between the at least two sub-word paths, such that information may be shared between the at least two sub-word paths; and a decoder coupled with the at least two subword paths, the decoder to decode the encoded data sub-word into the data sub-word; such that data sub-words form the data word.

Another preferred embodiment, of the present invention, is a method for transmitting a data word in a data processing system, the method comprising: receiving data sub-words onto sub-word paths, the data sub-words comprising sets of data elements of the data word; encoding the data sub-words into encoded data sub-words, such that the encoded data sub-words form an encoded data word wherein the information content of the data word is spread between the encoded data sub-words and the weight of the encoded data sub-words; transmitting the encoded data sub-words over a parallel encoded data line bus; receiving the encoded data sub-words onto the sub-word paths, the encoded data sub-words comprising sets of data elements of the encoded data word; allowing communication, between the sub-word paths, such that information may be shared between the sub-word paths; and decoding the encoded data sub-words into the data sub-words; such that the data sub-words form the data word.

The present invention includes methods and apparatuses which perform these methods, including data processing systems which perform these methods, and computer readable media which when executed on data processing systems cause the systems to perform these methods.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIG. 3 depicts a property of binary numbers, a binomial expansion, which shows the relationship between the number of elements in a binary word, n, the weight of the binary word, p, and the number of unique states available for the chosen weight p and binary word size n.

FIG. 4 is a table, which summarizes relevant properties of binary numbers, showing the minimum number of extra lines required to achieve constant-weight coding.

FIG. 13 shows the truth tables employed by the encoder blocks shown in FIG. 12.

FIG. 15 shows the truth tables employed by the encoder blocks shown in FIG. 14.

FIG. 17 shows the truth tables employed by the encoder blocks shown in FIG. 16.

FIG. 19 shows the truth tables employed by the decoder blocks shown in FIG. 18 for sub-word a.

FIG. 20 shows the truth tables employed by the decoder blocks shown in FIG. 18 for subword b.

FIG. 21 shows the truth tables employed by the decoder blocks shown in FIG. 18 for sub-word c.

FIG. 22 is an alternative embodiment for encoding, using binomial coefficient matrix encoding, comparing the decimal value, binary value, and the encoded value for integer numbers ranging from zero to 19.

DETAILED DESCRIPTION

The following description and drawings are illustrative of the invention and are not to be construed as limiting the invention. Numerous specific details are described to provide a thorough understanding of the present invention. However, in certain instances, well known or conventional details are not described in order to avoid obscuring the description of the present invention. References to one or an embodiment in the present disclosure are not necessarily references to the same embodiment; and, such references mean at least one.

Figure 1:
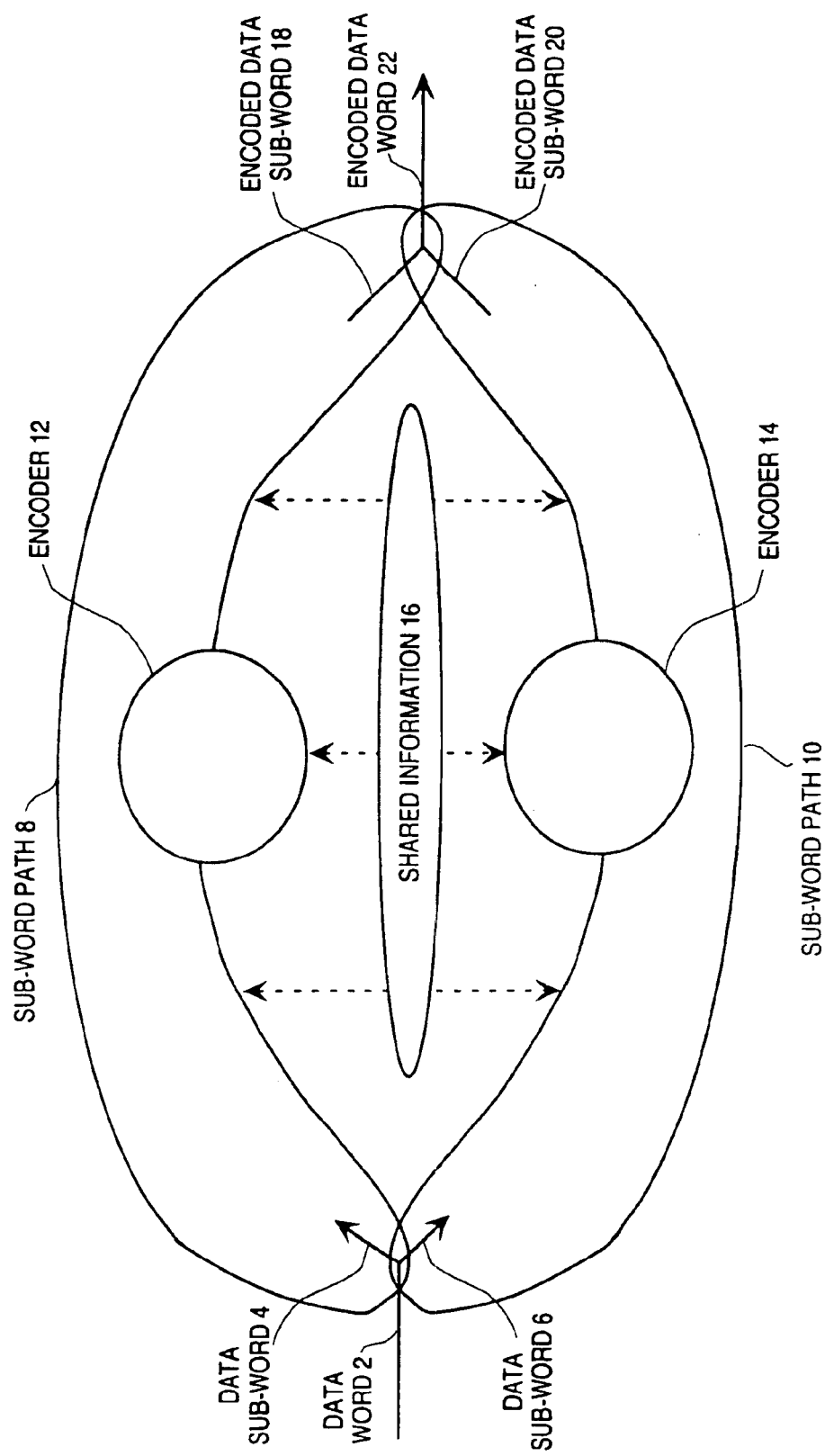
FIG. 1 depicts multiple sub-word paths and information sharing between sub-word paths, along with input data word to encoded data word flow.

FIG. 1 depicts multiple sub-word paths and information sharing between sub-word paths, along with input data word to encoded data word flow. With reference to FIG. 1, data word 2 is split into data sub-word 4 and data sub-word 6. Data sub-word 4 travels along sub-word path 8 and data sub-word 6 travels along sub-word path 10. Encoder 12 is connected with sub-word path 8 and encodes data sub-word 4. Encoder 14 is connected with sub-word path 10 and encodes data sub-word 6. It will be appreciated that many alternatives are possible, for example, encoder 12 could be comprised of a plurality of encoders or encoder 12 and encoder 14 could be a single encoder connected with both sub-word path 8 and sub-word path 10. A plurality of encoders in contact with a sub-word path could encode the sub-word in parallel.

Shared information 16 allows information to be shared between sub-word paths. Shared information 16 can occur anywhere along the sub-word paths. For example, shared information 16 could occur before encoder 12, shared information 16 could occur between encoder 12 and encoder 14. Shared information 16 could occur between the sub-word paths after the encoders. It will be appreciated that shared information 16 could occur between sub-word path 8 and sub-word path 10 in orders not specifically defined, the order does not limit the present invention.

Data sub-word 4 travels along sub-word path 8 and is encoded by encoder 12, encoded data sub-word 18 results from shared information 16 and encoder 12. Data sub-word 6 travels along sub-word path 10 and is encoded by encoder 14, encoded data sub-word 20 results from shared information 16 and encoder 14. Encoded data sub-word 18 and encoded data sub-word 20 are combined to form encoded data word 22. The encoding provided by encoder 12 and encoder 14 on data sub-word 4 and data sub-word 6 may result in encoded data word 22 being either, small-variance-weight, constant-weight, or balanced.

Figure 2:
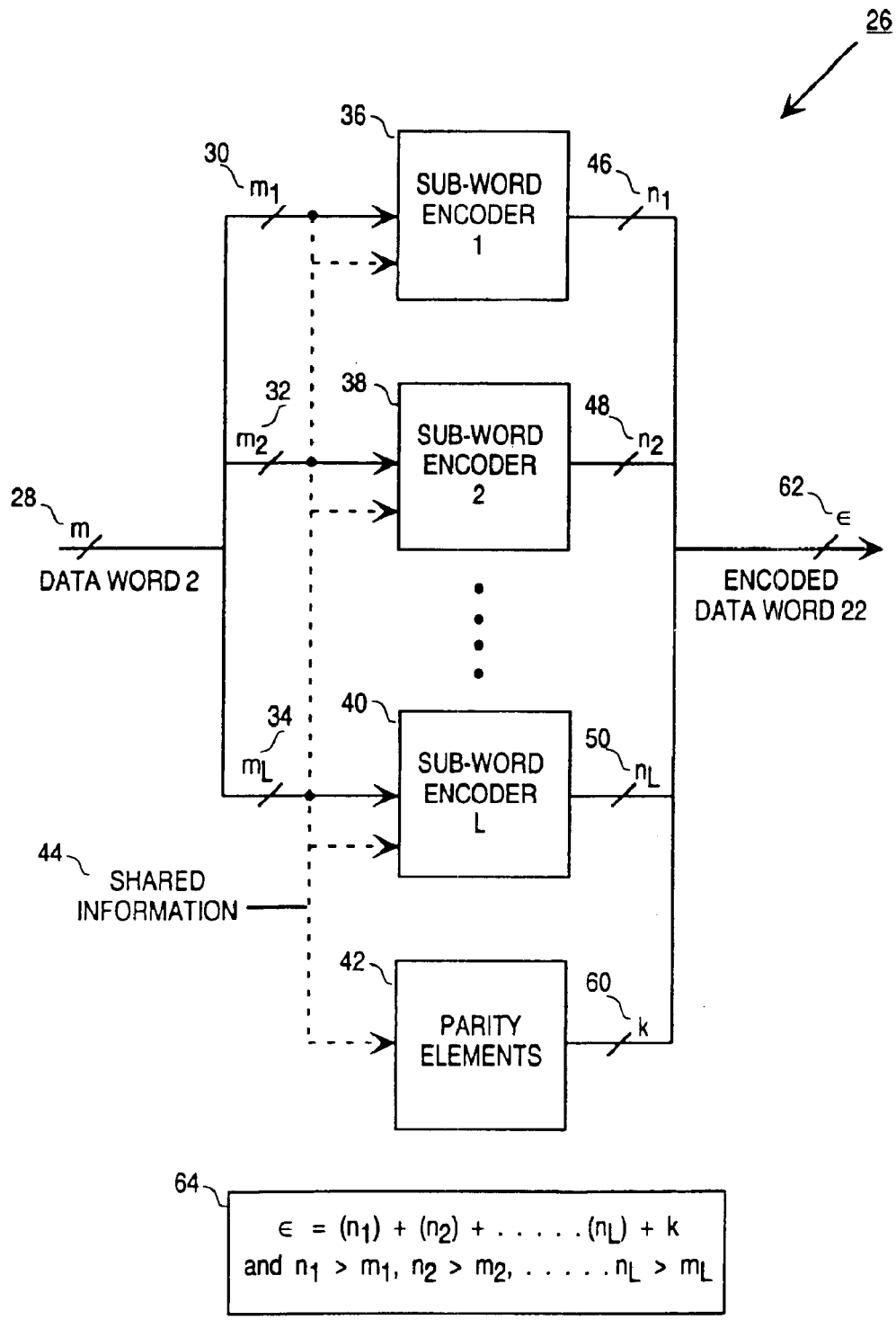
FIG. 2 applies the concept of shared information to the creation of a constant-weight encoded data word.

FIG. 2 applies the concept of shared information to the creation of a constant-weight encoded data word. With reference to FIG. 2, an embodiment of the present invention provides constant-weight weight encoding 26, accomplished with a plurality of encoders and a parity element that leads to a low latency logic integrated circuit implementation. Data word 2 is input on m input information word lines 28. Input information word lines m 28 are divided between sub-word 1 lines $m_1$ 30, sub-word 2 lines $m_2$ 32, up to sub-word L lines mL 34.

Sub-word 1 lines $m_1$ 30 connect with sub-word encoder 1 36. Similarly, sub-word 2 lines $m_2$ 32 connect with sub-word encoder 238 up to sub-word L lines $m_L$ 34 connecting with sub-word encoder L 40. It will be appreciated that input data word 2 may be divided into a general number of sub-words as indicated by index L. It will also be appreciated by those of skill in the art that the sub-words need not contain the same number of data elements from input data word 2, but can be of different size. The architecture shown in constant-weight weight encoding 26 is equivalent to the sub-word paths shown in FIG. 1 with the encoders connected with each sub-word path. Shared information 44 may be exchanged between sub-word 1 lines $m_1$ 30, sub-word 2 lines $m_2$ 32, sub-word 3 lines $m_3$ 34, sub-word encoder 1 36, sub-word encoder 2 38, sub-word encoder L 40, and parity elements 42.

Sub-word encoder 1 36 has lines $n_1$ 46 that are used to output the encoded data sub-word. Sub-word encoder 2 38 has lines $n_2$ 48 that are used to output the encoded data sub-word. Sub-word encoder L 40 has lines $n_L$ 50 that are used to output the encoded data word. The sub-words from sub-word encoder 1 36, sub-word encoder 2 38, up to sub-word encoder L 40 are combined with parity element 42 to form encoded data sub-word 22, which is output on total encoded lines 62. Equation 64 shows the relations between total encoded line count 62, and the line count from each sub-word encoder and parity lines 60.

FIG. 3 depicts a property of binary numbers, a binomial expansion, which shows the relationship between the number of elements in a binary word, n, the weight of the binary word, p, and the number of unique states available for the chosen weight p. With reference to FIG. 3, Binomial coefficient matrix 66 may be used for devising various methods of encoding data words. One such method, leads to a low latency logic implementation in an integrated circuit. According to this method, it is desirable to break up a long data word into shorter sub-words. Shorter sub-words can be encoded in less time than longer data words. With reference to binomial coefficient matrix 66, it will be noted that an encoded word seven elements in length, n=7, has 35 states in which there are three ones, p=3 and 35 states in which there are four ones, p=4. Therefore, a total of 70 states exist in the encoded word with either three or four ones in each encoded data word.

FIG. 4 is a table, which summarizes relevant properties of binary numbers, showing the minimum number of extra lines required to achieve constant weight coding. With reference to FIG. 4, table 68 indicates the minimum number of extra lines necessary for each input word length encoded. The last column titled "extra lines" represents encoding optimized to provide a minimum number of extra lines. The best mode of the present invention will add one extra line over the optimum shown in table 68 for encoding a binary word size of 18, resulting in 22 encoded bits in the encoded data word. However, decreased encode time is achieved with the combination of smaller sub-word size and sharing of information across sub-word paths. Thus, the best mode of the present invention encodes three 6-bit input words with a total of 22 encoded lines, which is two lines less than the 24 required by binomially encoding three 6-bit input words.

Figure 5:
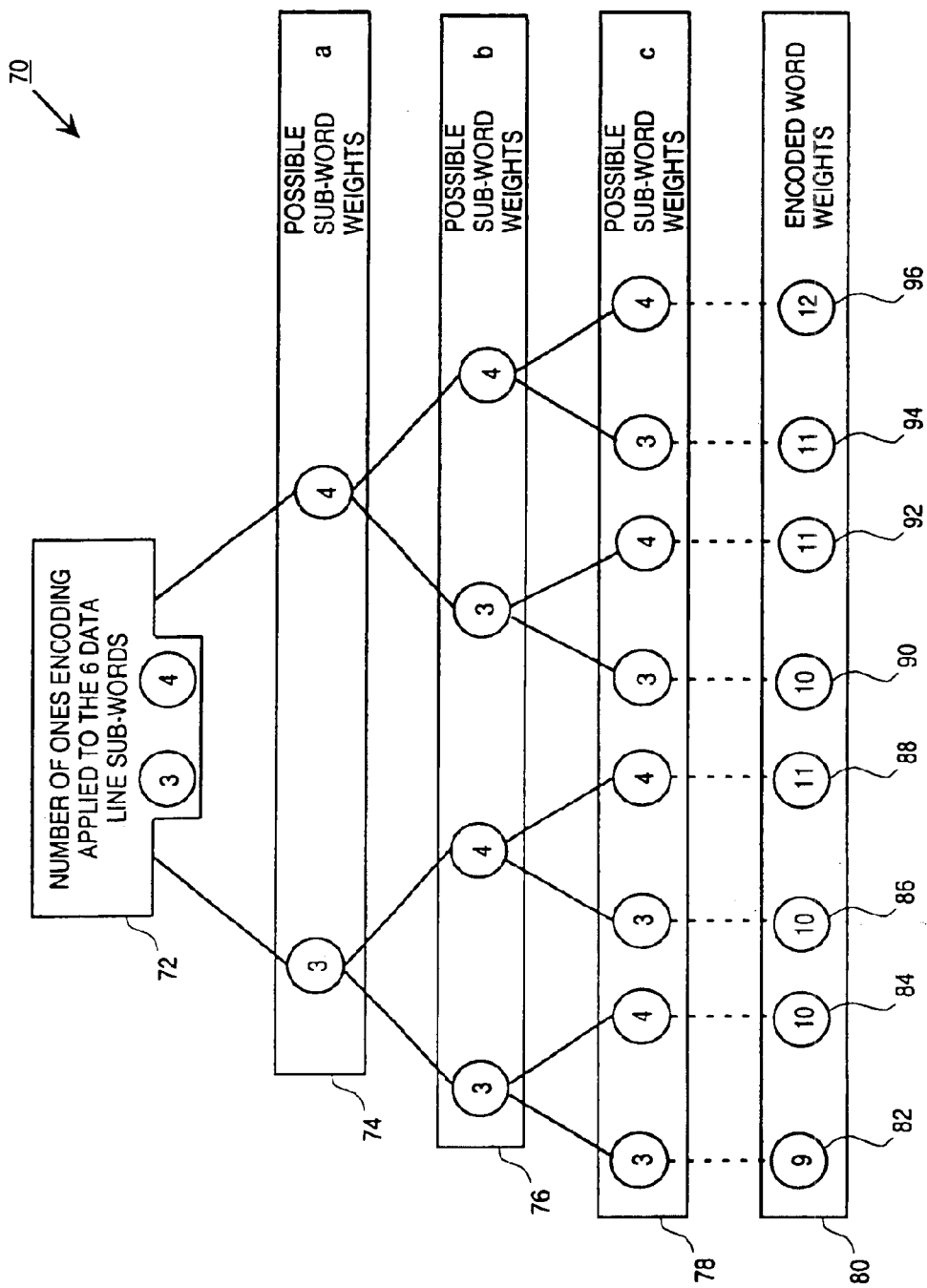
FIG. 5 is a code-weight vector tree that depicts parallel encoding within a sub-word, spreading information into the sub-words, and the resulting encoded word weights that result without sharing information across sub-words.

FIG. 5 is a code-weight vector tree that depicts parallel encoding within a sub-word, spreading information into the sub-words and the resulting encoded word weights that result without sharing information across sub-words. With reference to FIG. 5, code-weight vector tree 70 shows the encoded word weights that are possible when an 18-bit word is divided into three sub-words, each 6-bits in length, according to one embodiment of the present invention. Number of encoding weights applied to a sub-word 72 applies weights three and four to sub-words a, b, and c. Weights for sub-word a 74, weights for sub-word b 76, and weights for sub-word c 78 show the possible branches of the tree that result in encoded word weights 80. Encoded word weights 80 include encoded word weights that range from nine to 12. Encoded word weight 82, which results in a total encoded word weight of nine, results from encoded sub-word weights of three for each sub-word. Encoded word weight 96, which results in a total encoded word weight of 12, results from encoded sub-word weights of four for each sub-word. The branches of the code-weight vector tree (FIG. 5) are listed as rows in Table 1 along with the corresponding reference numeral for the encoded word weight.

Transmission of encoded word weights 80 results in a small-variance-weight encoding scheme. The small-variance-weight encoded words have a much narrower weight range than do the input data words. 18-bit input data word values range between all zeros and all ones, causing the word weight to ranging from zero to 18. The small-variance-weight encoded data word weights vary from nine to 12 for an encoded data word utilizing 21 lines. The reduced weight variance provides an improved solution to the problems described earlier with Vdd and Vss current fluctuations during transmission.

TABLE 1

Code weight vectors from FIG. 5

| Weight of Sub-word a | Weight of Sub-word b | Weight of Sub-word c | Encoded word weights 80 (FIG. 5) | Encoded word weight reference numeral (FIG. 5) |
| --- | --- | --- | --- | --- |
| 3 | 3 | 3 | 9 | 82 |
| 3 | 3 | 4 | 10 | 84 |
| 3 | 4 | 3 | 10 | 86 |
| 3 | 4 | 4 | 11 | 88 |

TABLE 1-continued

Code weight vectors from FIG. 5

| Weight of Sub-word a | Weight of Sub-word b | Weight of Sub-word c | Encoded word weights 80 (FIG. 5) | Encoded word weight reference numeral (FIG. 5) |
|---|---|---|---|---|
| 4 | 3 | 3 | 10 | 90 |
| 4 | 3 | 4 | 11 | 92 |
| 4 | 4 | 3 | 11 | 94 |
| 4 | 4 | 4 | 12 | 96 |

However, further reduction in the variance of the encoded word weight can be achieved by employing shared information across sub-word paths in order to produce constant weight encoded data. By inspecting the range of encoded word weight, nine to 12, it is evident that by encoding two ones, and employing a single parity line, balance constant-weight encoded data words will be achieved with weight of 11, on 22 total lines by allowing communication between sub-word paths.

Each branch of code weight vector tree 70 encodes a constant number of states for an encoded sub-word of length 7 bits, $$2^6 \cdot 2^6 \cdot 2^6 = 262,144.$$

Each code weight vector encodes the same number of states:

$$2^5 \cdot 2^5 \cdot 2^5 = 2^{15}.$$

There are eight code weight vectors in the tree as indicated by the eight rows in table 1. Therefore the total number of states encoded is:

$$8 \cdot 2^{15} = 2^{18}.$$

No information is carried by the weight of the code at each level because at each level the code can be either three or four. Knowing the weight at any level in the tree does not help you determine how to encode the sub-word at any other level. Thus there are no constraints placed on the weight, except that they must be either three or four. The resulting code-weight vectors range from nine to 12 as shown in encoded word weights 80.

The code variance at each level in the tree of FIG. 5 is three or four. If the variance is increased to two, three, four, or five, the total number of possible states becomes:

$$(2^4 = 2^5 = 2^4)^3 = 844,736.$$

Only 262,144 states of the possible 844,736 states are needed to encode 18-*bit* input numbers. The fully-expanded tree diagram would contain 84 nodes and the code-weight vectors encoded word weight would range from 6 to 15. However, we only need a subset of the code-weight vectors to cover 262,144 input states. The tree diagram of FIG. 6 contains 20 nodes, which are sufficient to cover 262,144 input states. Each code-weight vector encodes the following number of states:

code-weight vector {2,4,4} contains 16,384 states;
code-weight vector {3,3,5} contains 16,384 states;
code-weight vector {4,4,2} contains 16,384 states;
code-weight vector {5,3,3} contains 16,384 states;
code-weight vector {3,3,4} contains 32,768 states;
code-weight vector {3,4,4} contains 32,768 states;
code-weight vector {4,3,3} contains 32,768 states;
code-weight vector {4,3,4} contains 32,768 states;
code-weight vector {4,4,3} contains 32,768 states.

The sum of these code-weight vectors contain 262,144 states and the weight is either 10 or 11. By adding a single parity bit, the almost-constant code of 10 or 11 can be made into a constant (and balanced) code of 11.

Figure 6:
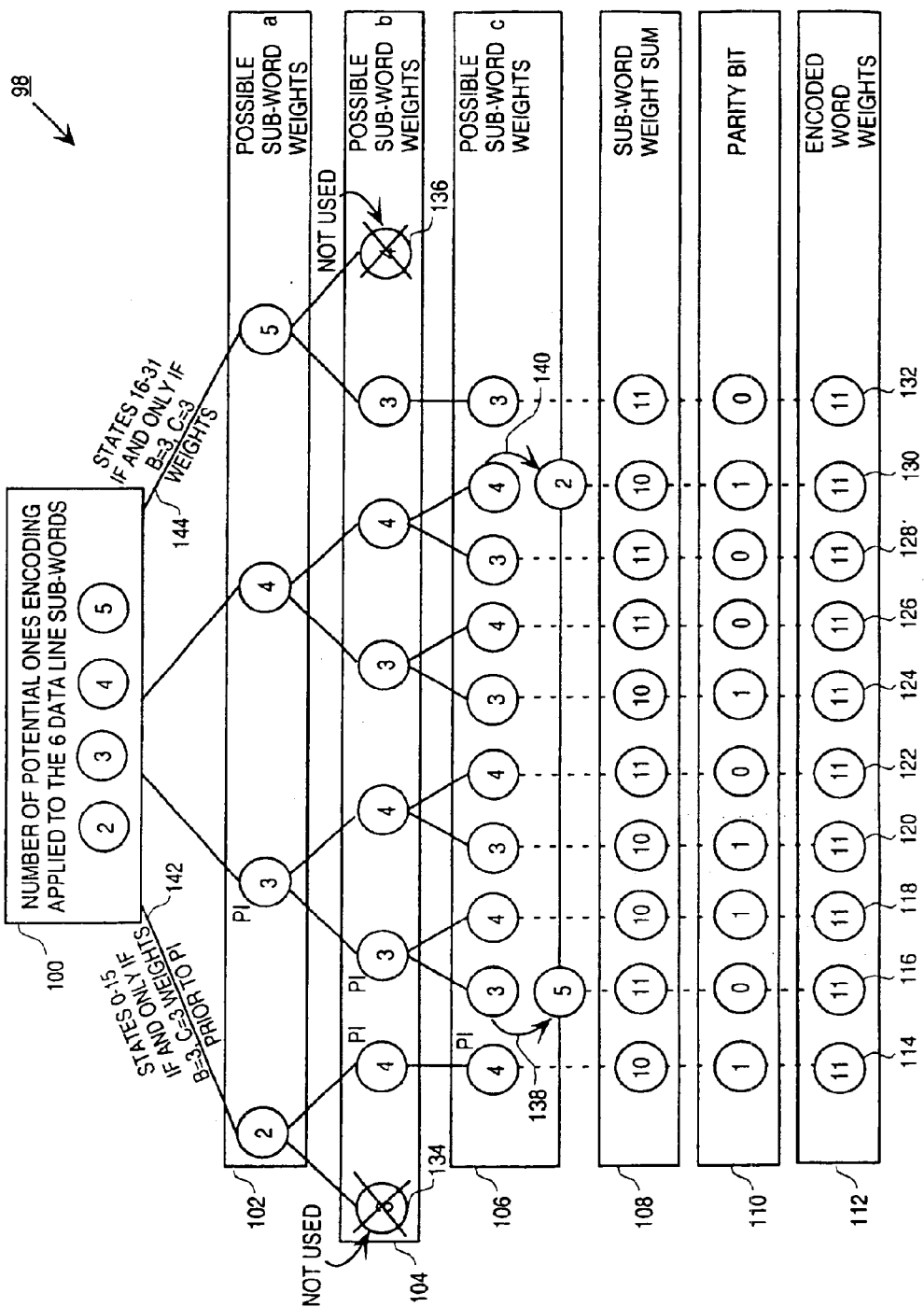
FIG. 6 is a code-weight vector tree that depicts parallel encoding within sub-words, information sharing across sub-words, spreading information into the sub-words as well as the weight of the sub-word, and then using the shared information to achieve a constant-weight encoded data word.

FIG. 6 is a code-weight vector tree that depicts parallel encoding within sub-words, spreading information into the sub-words as well as the weight of the sub-word, information sharing across sub-words, and then using the shared information to achieve a balanced constant-weight encoded data word.

With reference to FIG. 6, information carried in the individual sub-word weights is used to encode the other sub-words. For example, if sub-word a is 2, then sub-words b and c must have weight 4 as shown 10 FIG. 6.

It will be appreciated by those with skill in the art that an encoded sub-word of weight three and length seven can be simply converted to a sub-word of weight four by inverting each of the output data elements and vice versa. Likewise, an encoded sub-word of weight two and length seven can be simply converted to a sub-word of weight five by the same inversion technique which also applies vice versa.

According to the best mode of the present invention, the determination of the encoded sub-word weight is made by examining the most significant one or two bits of the individual sub-words. The encoding for sub-channel a based on the input bits $d_0 \ldots d_5$ of FIG. 11 and the most significant bit from sub-word b ($d_{11}$) and the two most significant bits from sub-word c ($d_{17}$ and $d_{18}$). If the most significant bit of sub-words a, b, and c are all zero, then the first sixteen sub-words of the subword a are encoded with weight two and the second set of sixteen encoded sub-words of sub-word a are encoded with five. Otherwise, the first thirty-two encoded sub-words of sub-word a are of weight three and the next thirty-two encoded sub-words of sub-word a are of weight four. There is one exception in accordance with the code-weight vector tree diagram of FIG. 6. If the most significant bit of sub-word b and the two most significant bits of sub-word c are all one, then the second set of thirty-two states are of weight three.

Figure 11:
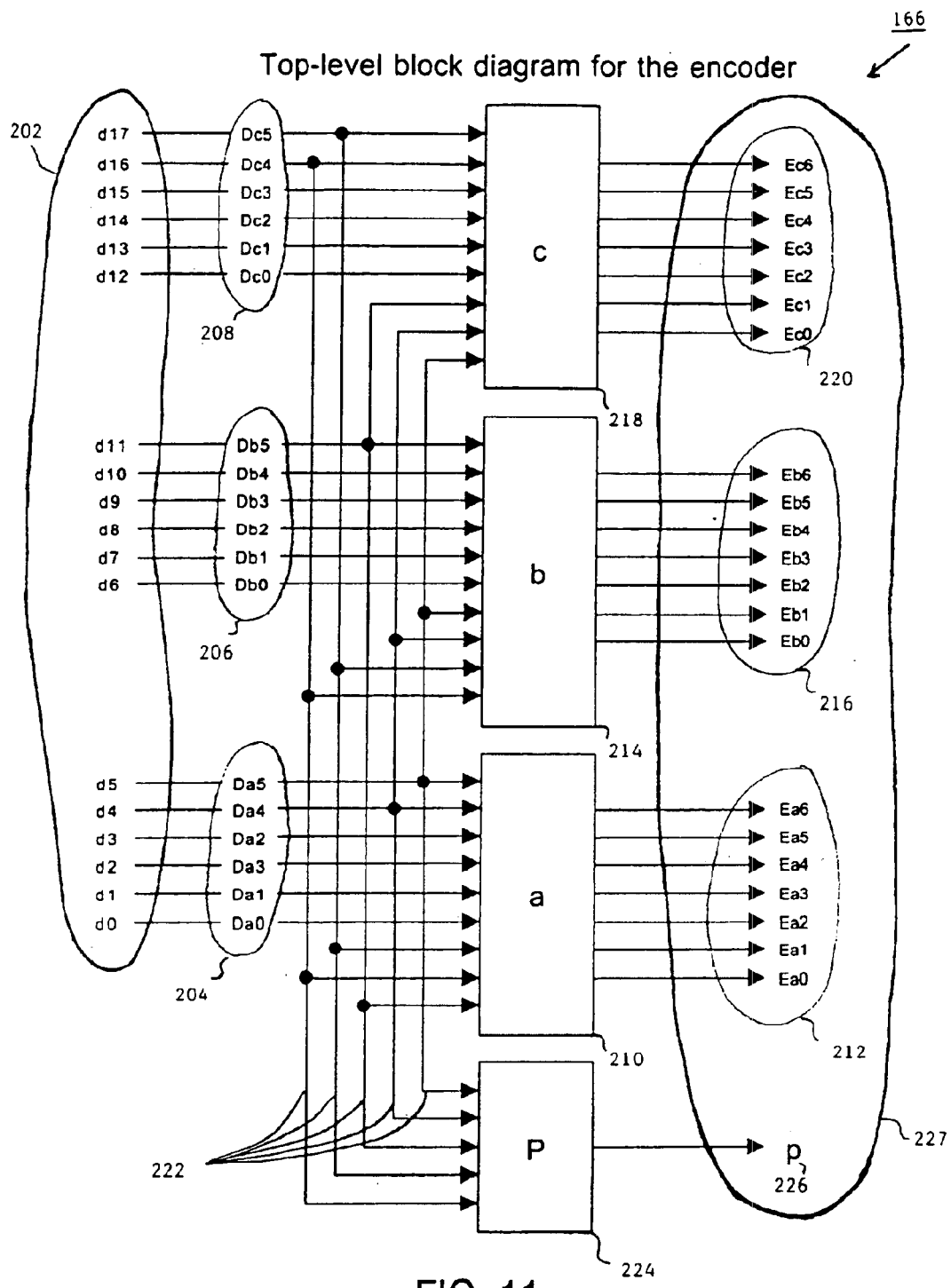
FIG. 11 is an embodiment illustrating the best mode of the present invention as applied to an encoder for the specific case of encoding an 18-bit data word.

The encoding for the sub-words of sub-word b is based in the input bits $d_6 \ldots d_{11}$ of FIG. 11 and the two most significant bits from sub-word a ($d_5$ and $d_4$) and the two most significant bits from sub-word c ($d_{17}$ and $d_{16}$). The first thirty-two encoded sub-words of sub-word b are weight three and the second set of thirty-two encoded sub-words of sub-word c are of weight four. There are two exceptions in accordance with the weight-code vector tree diagram of FIG. 6. The first exception is that if the most significant bit of sub-word a is one and the two most significant bits of sub-word c are one then the second-set of thirty-two sub-words of sub-channel c are of weight three. The second exception is that if the most significant bit of sub-word a is zero and the two most significant bits of sub-word c are zero then the first set of thirty-two sub-words of the sub-channel c are of weight four.

From the previous discussion of FIG. 3 it will be noted that a seven element encoded word has 35 states in which there are three ones and 35 states in which there are four ones, always set high, thus a 6-bit data word can be encoded by using both sets of states. A 6-bit data word requires 64 states, leaving six states unused. The first 32 states of the 6-bit input word will be encoded with three ones and the second 32 states will be encoded with four ones. Exceptions to this encode scheme will occur when the three input sub-words result in weights of three or weights of four being generated simultaneously in each encoded sub-word. Alternative encoding is required to handle the encoded word weights of nine and 12 shown in FIG. 5 and Table 1. With reference to FIG. 6, code-weight vector tree 98 shows the encoded sub-word weights that are possible in the encoding architecture for an 18-bit input data word divided into three 6-bit sub-words.

Weights for subword a 102 include encoding sub-word a with two ones or the inverse of two ones encoding which is five ones encoding along with three and four ones encoding. It will be appreciated by those of skill in the art that four ones encoding is the inverse of three ones encoding. Alternative encode paths 142 and 144, for encoding two ones and encoding five ones respectively, in sub-word a, are alternative encodings that are done in conjunction with information sharing in order to reduce the weight variance of the encoded word weights that result in nine or 12. Selective use of alternative encode paths 142 and 144 result in paths 134 and 136 being bared from use in the alternative encoding scheme. Thus, additional encoding states exist for which are not used. Weights for sub-word b 104 are limited to three ones or four ones encoding. Weights for sub-word c 106 include two, three, four, and five ones encoding.

Information sharing across sub-words reduces the weight variance of the encoded data words and ultimately made constant. For the case of each sub-word simultaneously encoding into a weight of three, the 32 states in sub-word a, are split into two cases with 16 states in each. The first case (states 0 to 15) is encoded using two ones. According to the best mode of the present invention, this case was chosen to occur when the second most significant bit (MSB) of sub-word a is equal to zero. Many others ways of making this choice exist. Encoded sub-words b and c are inverted which changes the weight of sub-words b and c from three to four. The resulting code weight vector {2,4,4} is shown in code-weight vector tree 98 resulting in sub-word weight sum 108 of ten resulting in encoded word weight 114 equal to eleven by setting parity bit value 110 to one. The inversion of the pre-balanced encoded sub-words b and c is called post inversion (PI).

The fact that the weight of encoded sub-word a equals two imparts the information that on decode, the inversion of encoded sub-words b and c must be considered. Thus, information is shared across sub-word paths in terms of the weight of the sub-word.

The second case for each sub-word simultaneously encoding into a weight of three (states 16 to 31) requires sub-word a to be encoded with five ones. In the best mode, of the present invention, this case occurs when the second MSB of sub-word a is equal to one. The resulting code-weight vector {5,3,3} is shown in code-weight vector tree 98 resulting in sub-word weight sum 108 of eleven resulting in encoded word weight 132 equal to eleven, by setting parity bit value 110 to zero. No PI of encoded sub-word b or c is required.

It will be appreciated that the case of each sub-word encoding into a weight of three ones occurs when the first MSB of each sub-word equals zero. When the second MSB of encoded sub-word a equals zero encoded sub-words b and c must be decoded accordingly.

The special case of each encoded sub-word resulting in a weight of four is treated with alternative encoding 138 and alternative encoding 140 applied to sub-word c. In the best mode, of the present invention, the second MSB of sub-word c is used to split the encoding for sub-word c into the two cases. When the second MSB of sub-word c equals zero the first 16 states (0 to 15) are encoded using two ones, alternative encoding 140, and when the second MSB of sub-word c equals one, the second 16 states (16 to 31) are encoded using five ones, alternative encoding 138.

The first case using alternative encoding 140 results in code-weight vector {4,4,2} as shown in code weight vector tree 98 resulting in sub-word weight sum 108 equal to ten resulting in encoded word weight 130 equal to 11 by setting parity bit value 110 to one. No PI of encoded sub-word a or b is required.

The second case, when the second MSB of sub-word c equals one and sub-word c is encoded using five ones, alternative encoding 138, results in the need to invert encoded sub-words a and b. The resulting code weight vector {3,3,5} is shown in code-weight vector tree 98 resulting in sub-word weight sum 108 of eleven resulting in encoded word weight 116 equal to eleven by setting parity bit value 110 to zero. On decode, the weight of sub-word c equal to five will provide the information that encoded sub-words a and b need to be decoded accordingly because of the PI previously applied.

The shared information that is occurring in the encoding process just described is the first and second MSB of sub-words a and c, as well as the first MSB of sub-word b.

Alternative encoding is not required for combinations of mixed sub-word weights of three and four. Thus, encoded word weight 118, encoded word weight 120, encoded word weight 122, encoded word weight 124, encoded word weight 126, and encoded word weight 128, result from weight vectors that do not require alternative encoding.

The branches of the code-weight vector tree (FIG. 6) are listed as rows in Table 1 along with the corresponding reference numeral for the encoded word weight. Where post inversion is required, it is so indicated with the symbol PI next to the appropriate sub-word weight. It is evident from Table 2 that the weight variance of encoded data words has been reduced to range between 10 and 11. The single parity line is used to produce the desired constant-weight encoded data words.

TABLE 2

Code weight vectors from FIG. 6

| Weight of Sub-word a | Weight of Sub-word b | Weight of Sub-word c | Encoded word weights 112 (FIG. 6) | Encoded word weight reference numeral (FIG. 6) |
|---|---|---|---|---|
| 2 | 4 PI | 4 PI | 10 | 114 |
| 3 PI | 3 PI | 5 | 11 | 116 |
| 3 | 3 | 4 | 10 | 118 |
| 3 | 4 | 3 | 10 | 120 |
| 3 | 4 | 4 | 11 | 122 |
| 4 | 3 | 3 | 10 | 124 |
| 4 | 3 | 4 | 11 | 126 |
| 4 | 4 | 3 | 11 | 128 |
| 4 | 4 | 2 | 10 | 130 |
| 5 | 3 | 3 | 11 | 132 |

It will be appreciated by those of skill in the art that the embodiment of the present invention just described, is not limited to three sub-words, but is generally applicable, as shown in FIG. 2, to a general number of sub-words, L, indicated by sub-word encoder L 40 and a general number of parity lines 60.

Figure 7:
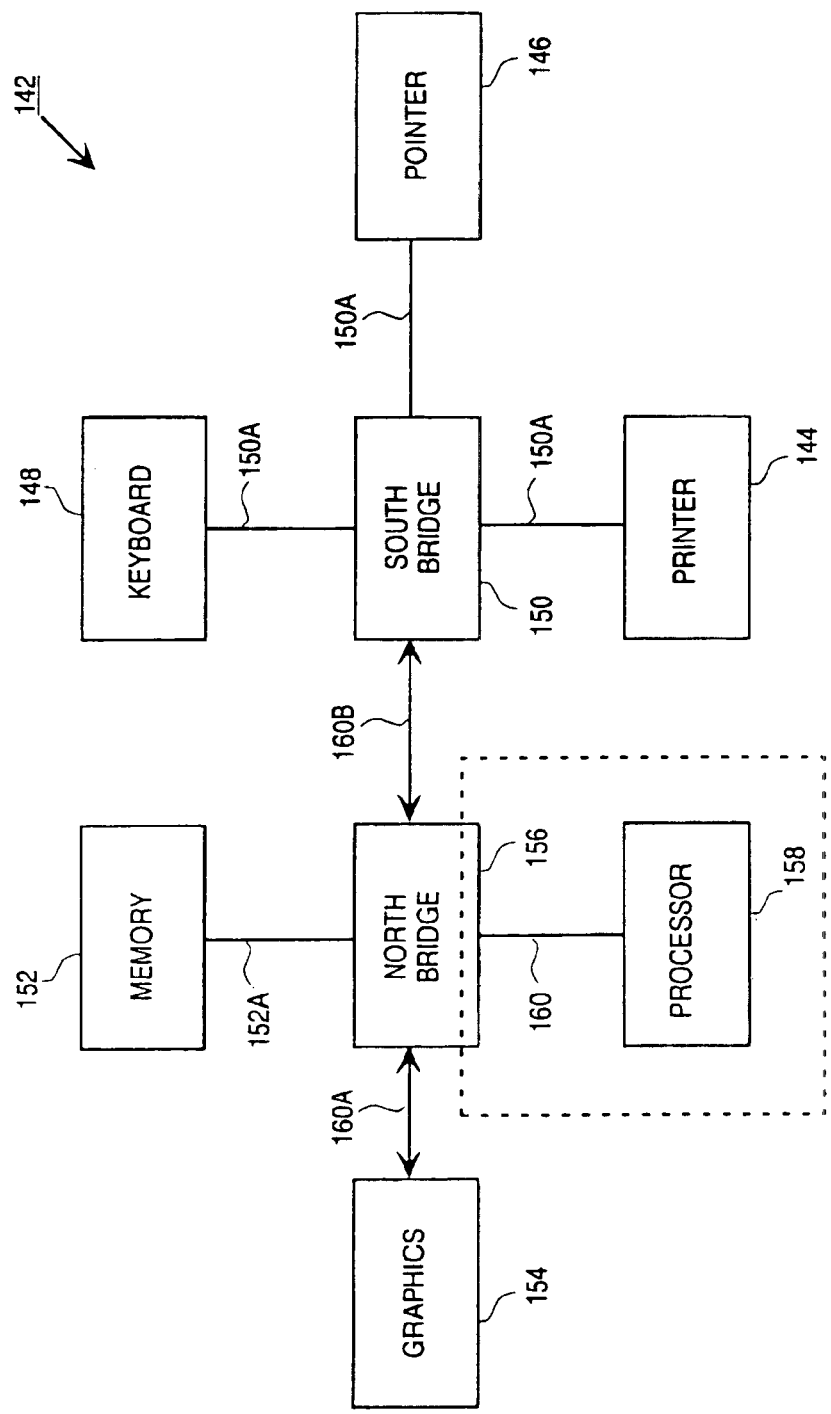
FIG. 7 shows the application of the present invention within a general purpose data processing system.

FIG. 7 shows the application of the present invention within a general-purpose data processing system. With reference to FIG. 7, general-purpose data processing system 142 might include printer 144, pointer 146, and keyboard 148, connected to south bridge 150 via bus 150a. North bridge 156 is connected to south bridge 150 via bus 160b, memory 152 via bus 152a, graphics 154 via bus 160a, and processor 158 via bus 160. Two devices on the bus 162 are shown employing an embodiment of the present invention. Encoded data bus 160 is shown between processor 158 and north bridge 156. The present invention may be used in other locations within general-purpose data processing system 142, for example bus 160a and 160b are examples of other locations in which the present invention could be employed. The present invention can be used in any situation in which data transmission occurs, the bus locations mentioned with respect to FIG. 7 are merely illustrative and are not to be construed in a limiting sense.

Figure 8:
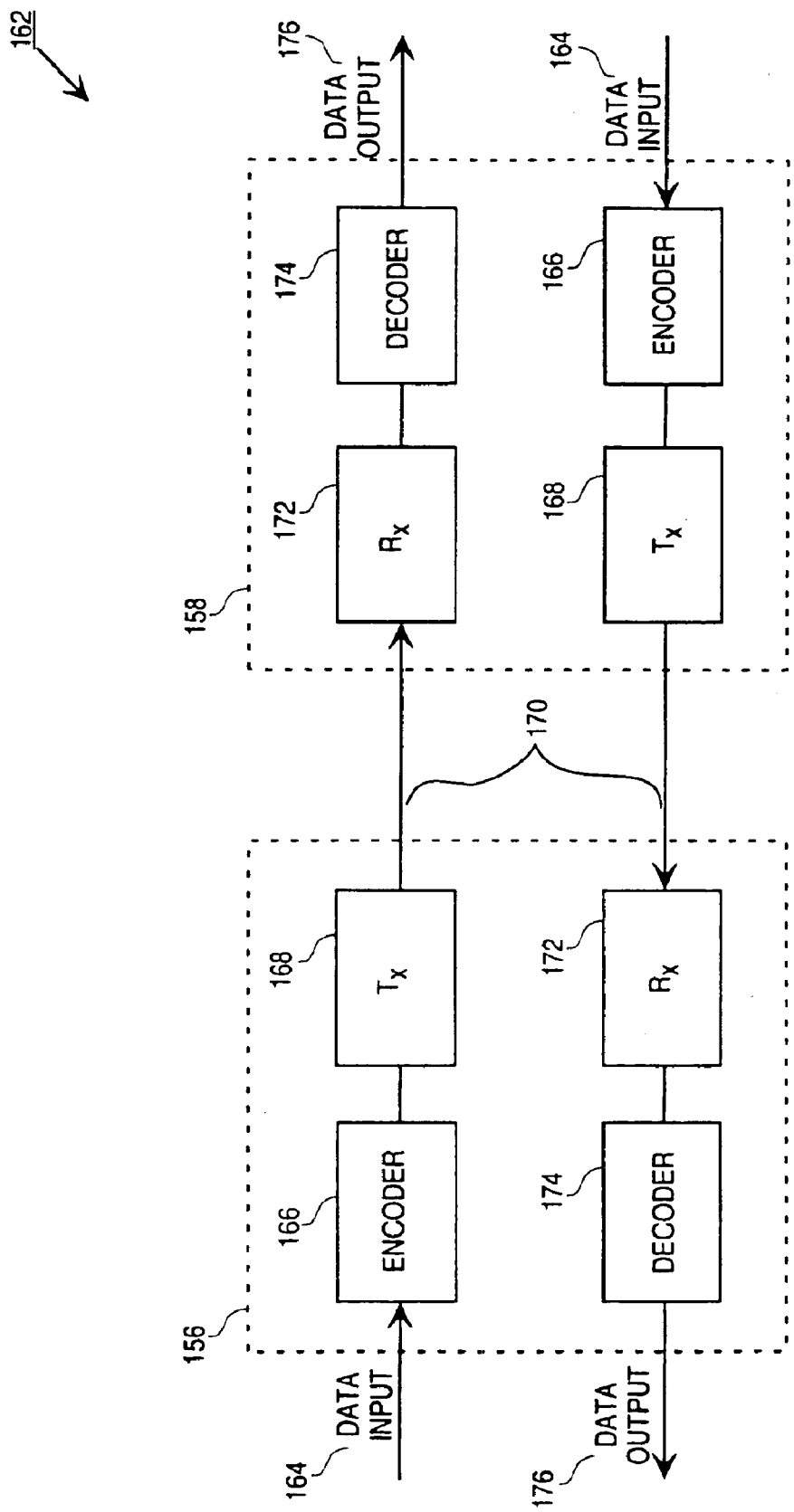
FIG. 8 is a detail representation of two devices on a parallel data line bus employing the present invention.

FIG. 8 is a detail representation of two devices on a parallel data line bus employing the present invention as seen previously in FIG. 7. With reference to FIG. 8, two devices on the bus 162 are shown employing an embodiment of the present invention. Input data word 164 could be an 18-bit data word, as previously discussed, entering encoder 166 of device-1 156. Input data word 164 would be encoded by encoder 166 and be transmitted by transmitter 168 onto parallel encoded data line bus 170 to device-2 158, also connected with parallel encoded data line bus 170. Device-2 158 may have receiver 172 and decoder 174 configured to receive and decode the encoded data word, thus outputting the data word at data output 176.

Each of the devices may employ the reciprocal ability to both receive data words as input, encode, transmit onto the parallel data lines, decode and output the data word as shown in FIG. 8.

Figure 9:
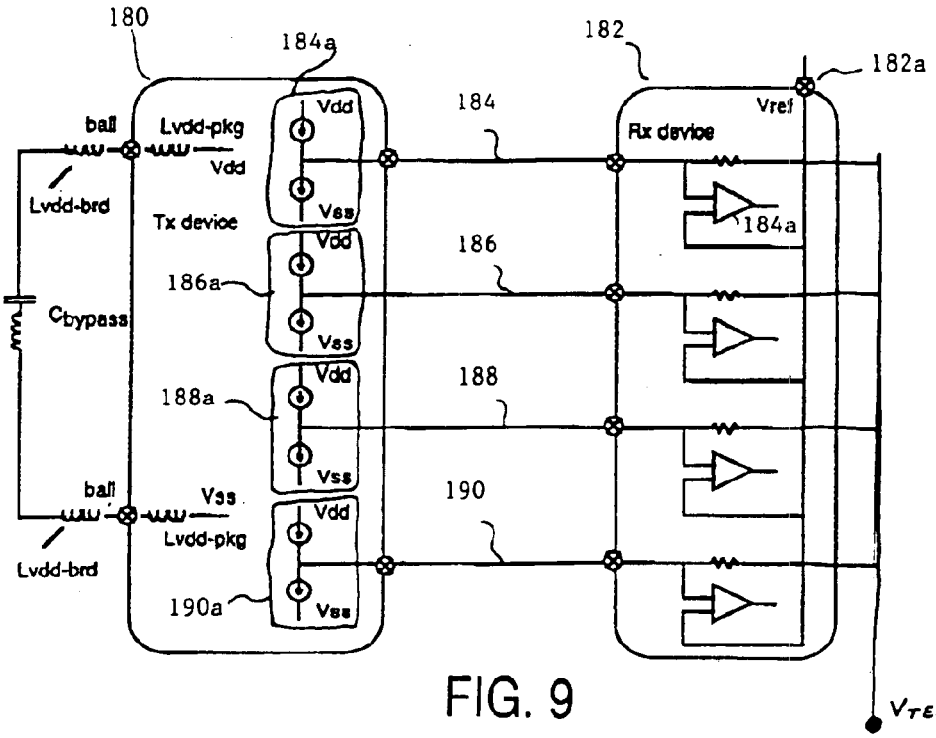
FIG. 9 shows the termination of the encoded parallel data lines according to the present invention, where less than two lines are required to transmit one bit of information.

FIG. 9 shows the termination of the encoded parallel data lines according to the present invention, where less than two lines are required to transmit one bit of information. With reference to FIG. 9, encoded line termination 178 is shown connecting transmit device 180 and receive device 182. Encoded data line 184, 186, 188, and 190 allow transmission of the encoded data word between transmit device 180 and receive device 182. Line drivers 184a, 186a, 188a, and 190a drive the encoded data lines. As previously discussed in the embodiment of the present invention directed to the encoding of an 18-bit data word, 22 total encoded data lines were used. 22 encoded data lines represents four more lines than would be required by single-ended architecture and 14 less lines than would be required by differential architecture.

Figure 10:
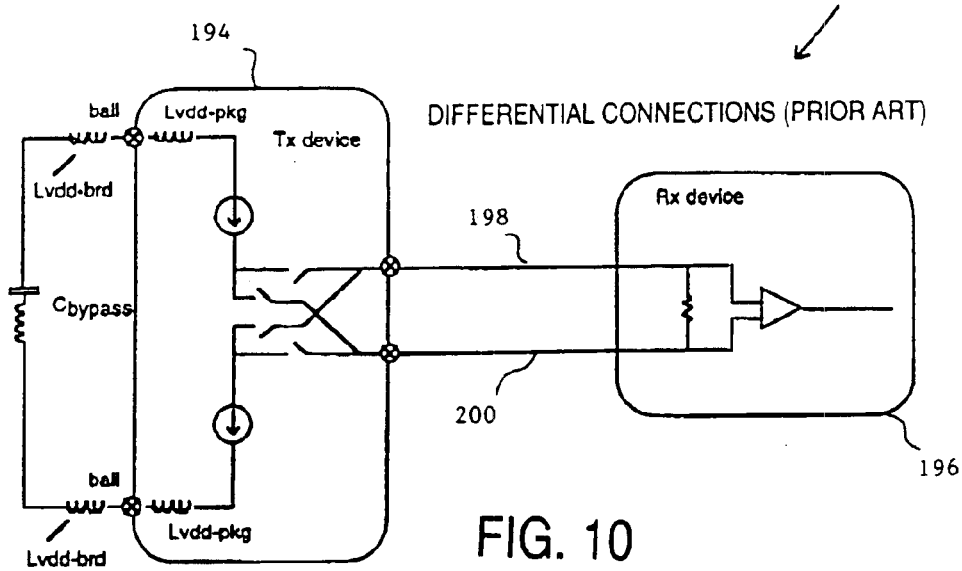
FIG. 10 depicts a prior art differential architecture termination of parallel data lines, where two lines are necessary to transmit one bit of information.

FIG. 10 depicts a prior art differential architecture termination of parallel data lines, where two lines are necessary to transmit one bit of information. With reference to FIG. 10, differential line termination 192 shows the termination necessary for two lines to connect transmit device 194 and receive device 196. Differential line 198 and differential line 200 are required to transmit one bit of information in a binary system between transmit device 194 and receive device 196.

FIG. 11 illustrates the best mode of the present invention applied to the specific case of encoding an 18-bit information word. With reference to FIG. 11, encoder 166 is shown in greater detail. Data word 202 is divided into subword a 204, subword b 206, and sub-word c 208. Sub-word a 204 is encoded by encoder a 210 resulting in encoded sub-word a 212. Sub-word a 204 includes input data lines Da0 to Da5, encoded data sub-word a 212 includes encoded data lines Ea0 to Ea6, thus six lines of input data are encoded onto seven encoded lines. Sub-word b 206 is encoded by encoder b 214 resulting in encoded sub-word b 216. Sub-word b 206 includes input data lines Db0 to Db5, encoded data sub-word b 216 includes encoded data lines Eb0 to Eb6. Sub-word c 208 is encoded by encoder c 218 resulting in encoded sub-word c 220. Sub-word c 208 includes input data lines Dc0 to Dc5, encoded data sub-word c 220 includes encoded data lines Ec0 to Ec6.

In FIG. 11, a sub-word path may be conceptualized as the path taken by the data sub-word from data word 202 on the input side of the encoder to the output side of the encoder, where the encoded sub-words merge together to form encoded data word 227. Shared information 222 flows between sub-word paths and parity logic 224. Based on shared information 222, parity logic 224 sets parity bit 226 to balance encoded data word 227. Encoded sub-word a 212, encoded sub-word b 216, encoded sub-word c 218, and parity bit 226 form encoded data word 227.

Alternative encoding, according to the best mode implementation for an 18-bit data word, requires shared information 222 to provide the value of the first and second MSB of sub-word a 204 and sub-word c 208 and the first MSB of sub-word b 206 on each sub-word path and at parity logic 224 to balance encoded data word 227. Post Inversion (PI) was applied in two cases; case one is the situation where the first MSB of each sub-word equals zero (Da5, Db5, Dc5) and the second MSB of sub-word a 204 equals zero (Da4), then encoded sub-word b 216 and encoded sub-word c 220 are inverted; case two is the situation where the first MSB of each sub-word (Da5, Db5, Dc5) equals one and the second MSB of sub-word c 208 equal one (Dc5), then encoded sub-word a 212 and encoded sub-word b 216 are inverted.

Figure 12:
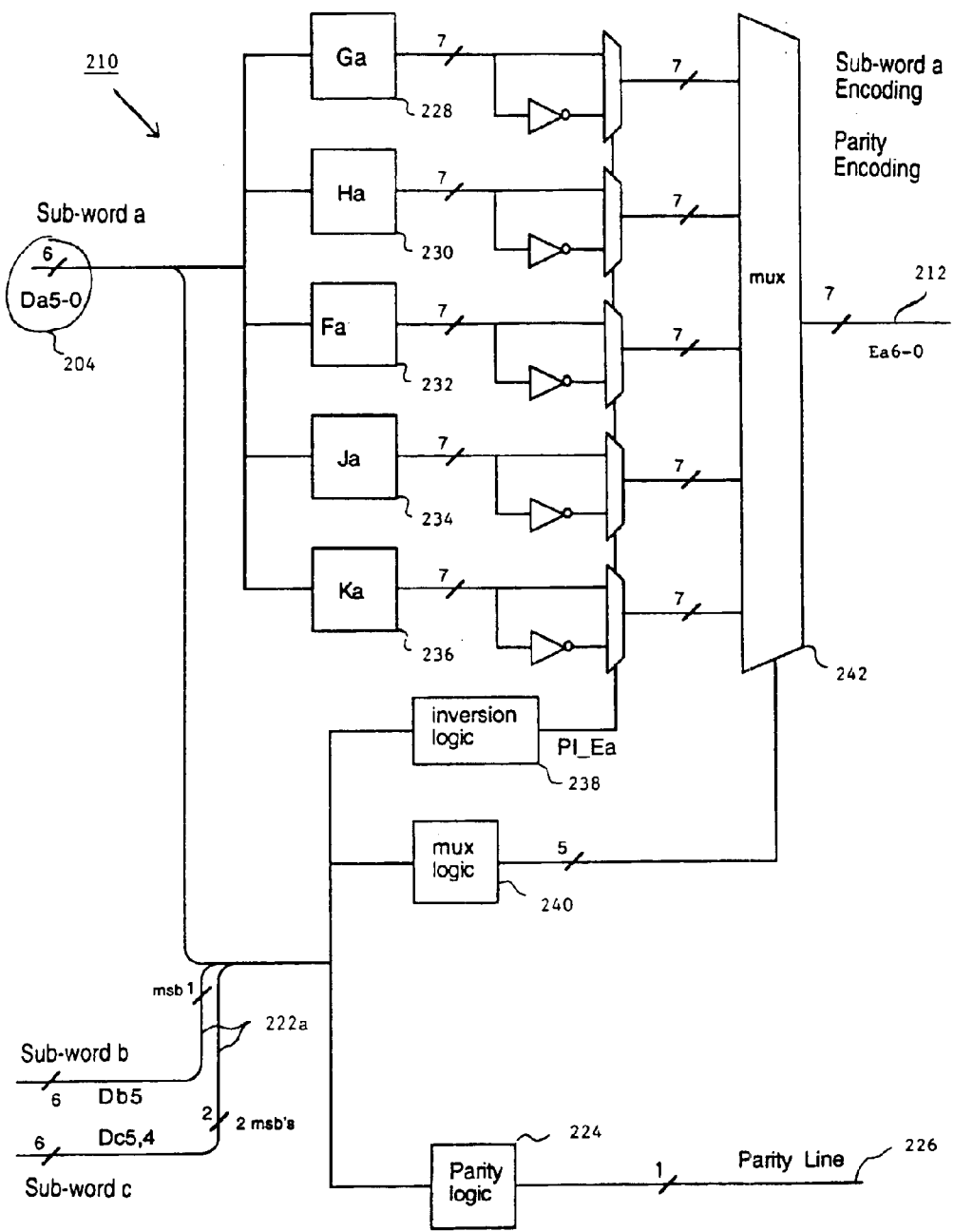
FIG. 12 is a further detail of the encoding applied to sub-word a according to the present invention.

FIG. 12 is a further detail of the encoding applied to sub-word a 204 by sub-word encoder 210 according to the present invention. With reference to FIG. 12, sub-word a 204 is encoded in parallel by Ga encoder block 228, Ha encoder block 230, Fa encoder block 232, Ja encoder block 234, and Ka encoder block 236. Shared information 222a is used by, parity logic 224 to set the state of parity bit 226, mux logic 240 to signal mux 242, and inversion logic 238 to perform post inversion for the cases requiring alternate encoding. Mux 242 together with mux logic 238 selects the encoded sub-word from Ga encoder block 228, Ha encoder block 230, Fa encoder block 232, Ja encoder block 234, or Ka encoder block 236 that is transmitted as encoded sub-word a 212.

Figure 13:
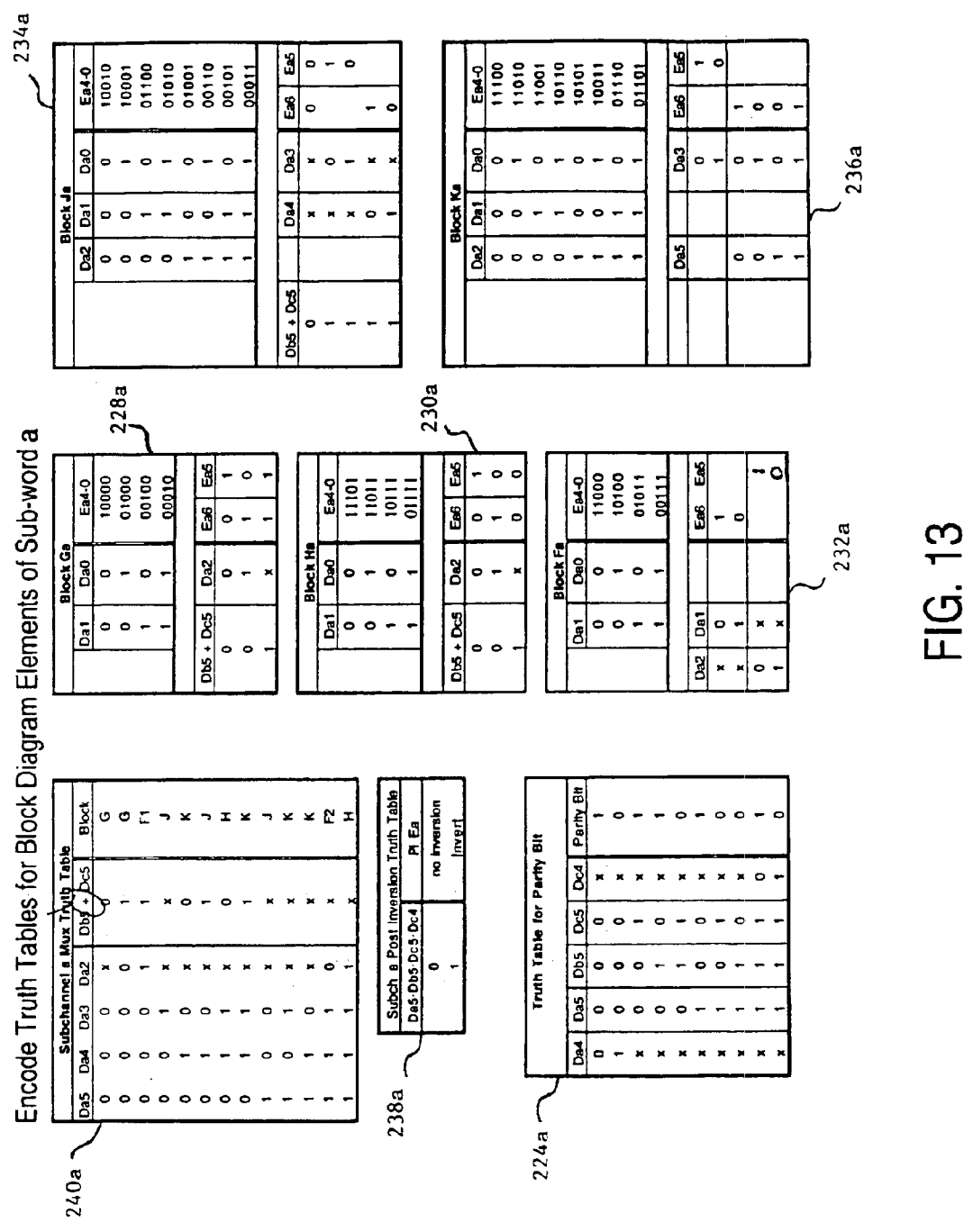

FIG. 13 shows the truth tables employed by the encoder blocks shown in FIG. 12. With reference to FIG. 13, mux truth table 240a displays the logic used by mux logic 240 (FIG. 12). Mux truth table 240a includes determination of the special cases requiring alternative encoding, the first MSB of each sub-word (Da5, Db5, Dc5) are considered in mux truth table 240a.

Distinct patterns between numbers of input least significant bits (LSBs) in the sub-words and numbers of LSBs in the encoded sub-words are used to form five unique patterns of encoding that are incorporated into the encoding blocks which have a measure of similarity across sub-words. The five distinct patterns result in Ga truth table 228a, Ha truth table 230a, Fa truth table 232a, 1a truth table 234a, and Ka truth table 236a. Ga truth table 228a is used by Ga encoder block 228 (FIG. 12). Ha Truth table 230a is used by Ha encoder block 230 (FIG. 12). Fa truth table 232a is used by Fa1, 2 encoder block 232 (FIG. 12). These three encoder blocks map the two least significant bits LSBs of sub-word a 204 (FIG. 12) into the five LSBs of the encoded sub-word. The two MSBs of the encoded sub-word may be chosen by considering a combination of the bits in sub-word a 204 (FIG. 12) and shared information 222a (Db5, Dc5, Dc4).

Ja truth table 234a is used by Ja encoder block 234 (FIG. 12), and Ka truth table 236a is used by Ka encoder block 236 (FIG. 12). These two encoder blocks map the three LSBs of sub-word a 204 (FIG. 12) into the five LSBs of the encoded sub-word.

Inversion logic truth table 238a is used by inversion logic 238 (FIG. 12) to invert encoded sub-word a 212 when alternate encoding is performed. It will be appreciated by those of skill in the art that post inversion may be performed after mux 242 (FIG. 12) as a particular application is considered. The present invention is not limited by the order of mux 242 and the inversion of encoded sub-word a 212.

Figure 14:
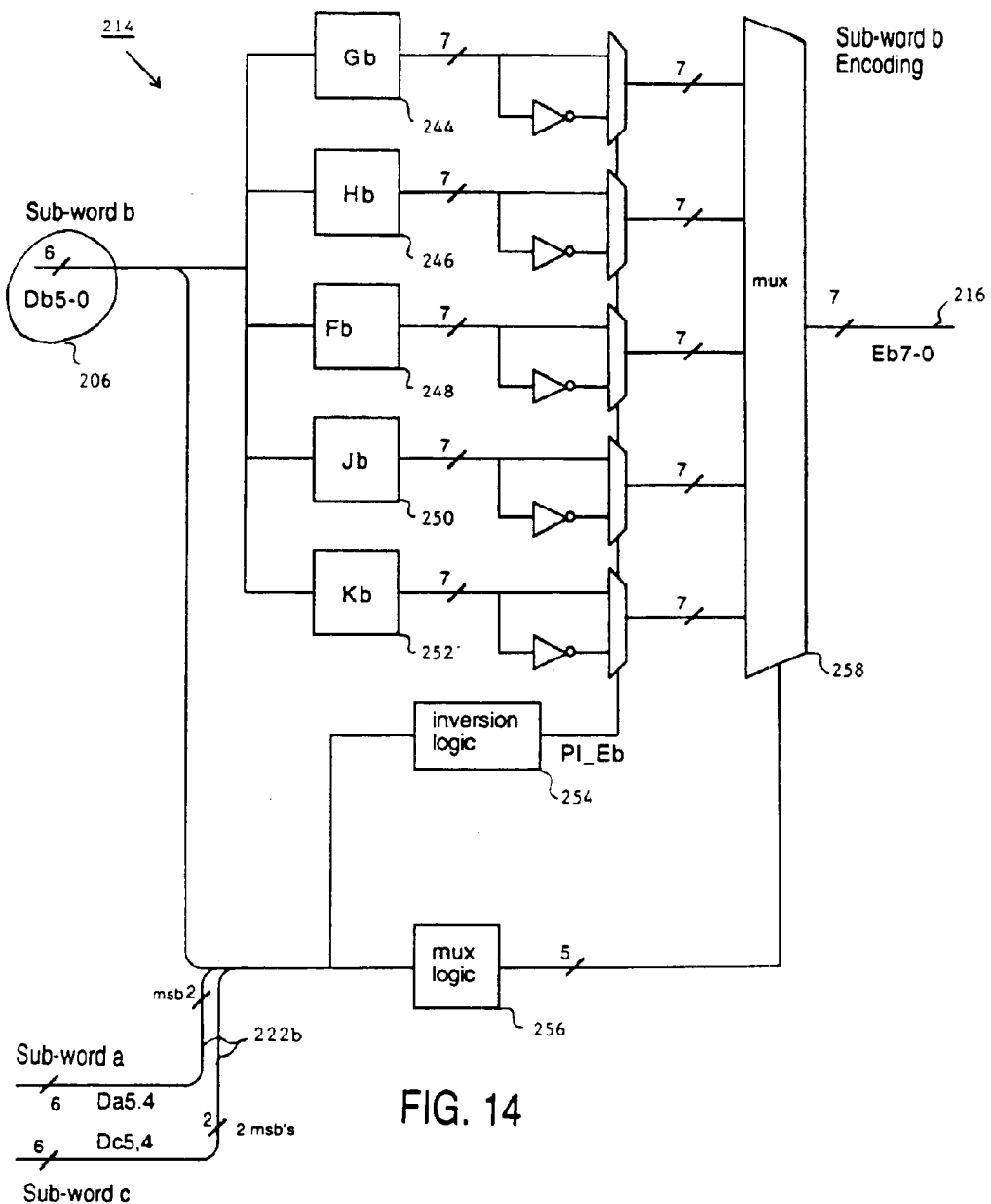
FIG. 14 is a further detail of the encoding applied to sub-word b according to the present invention.

FIG. 14 is a further detail of the encoding applied to sub-word b 206 by sub-word encoder 214 according to the present invention. With reference to FIG. 14, sub-word b 206 is encoded in parallel by Gb encoder block 244, Hb encoder block 246, Fb1, 2 encoder block 248, Jb encoder block 250, and Kb encoder block 252. Shared information 222b is used by mux logic 256 to signal mux 258 and inversion logic 254 to perform post inversion for the cases requiring alternate encoding. Mux 258 together with mux logic 256 selects the encoded sub-word from Gb encoder block 244, Hb encoder block 246, Fb1, 2 encoder block 248, Jb encoder block 250, or Kb encoder block 252 that is transmitted as encoded sub-word b 216.

Figure 15:
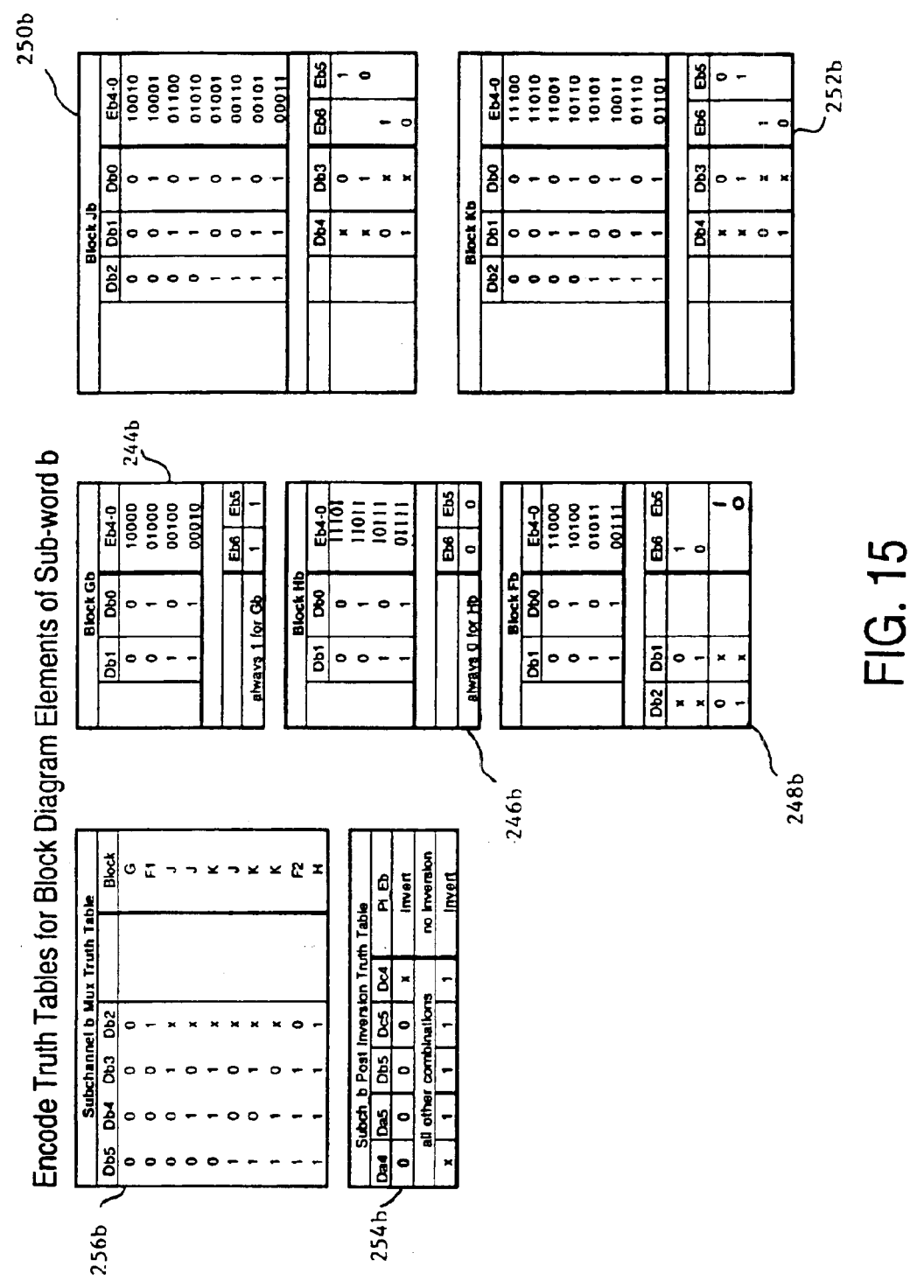

FIG. 15 shows the truth tables employed by the encoder blocks shown in FIG. 14. With reference to FIG. 15, mux truth table 256b displays the logic used by mux logic 256 (FIG. 14). Gb truth table 244b is used by Gb encoder block 244 (FIG. 14). Hb truth table 246b is use by Hb encoder block 246 (FIG. 14) and Fb truth table 248b is used by Fb 1, 2 encoder block 248 (FIG. 14). These three truth tables employ the same mapping between the two LSBs of the data sub-word and the five LSBs of the encoded sub-word as was used for sub-word a encoder blocks and truth tables.

Jb truth table 250b is used by Jb encoder block 250 (FIG. 14) and Kb truth table 252b is used by Kb encoder block 252 (FIG. 14). These two truth tables employ the same mapping between the three LSBs of the data sub-word and the five LSBs of the encoded sub-word as was used for sub-word a encoder blocks and truth tables.

Inversion logic truth table 254b is used by inversion logic 254 (FIG. 14) to invert encoded sub-word b 216 when alternate encoding is performed. It will be appreciated by those of skill in the art that post inversion may be performed after mux 258 (FIG. 14) as a particular application is considered. The present invention is not limited by the order of mux 258 and the inversion of encoded sub-word b 216.

Figure 16:
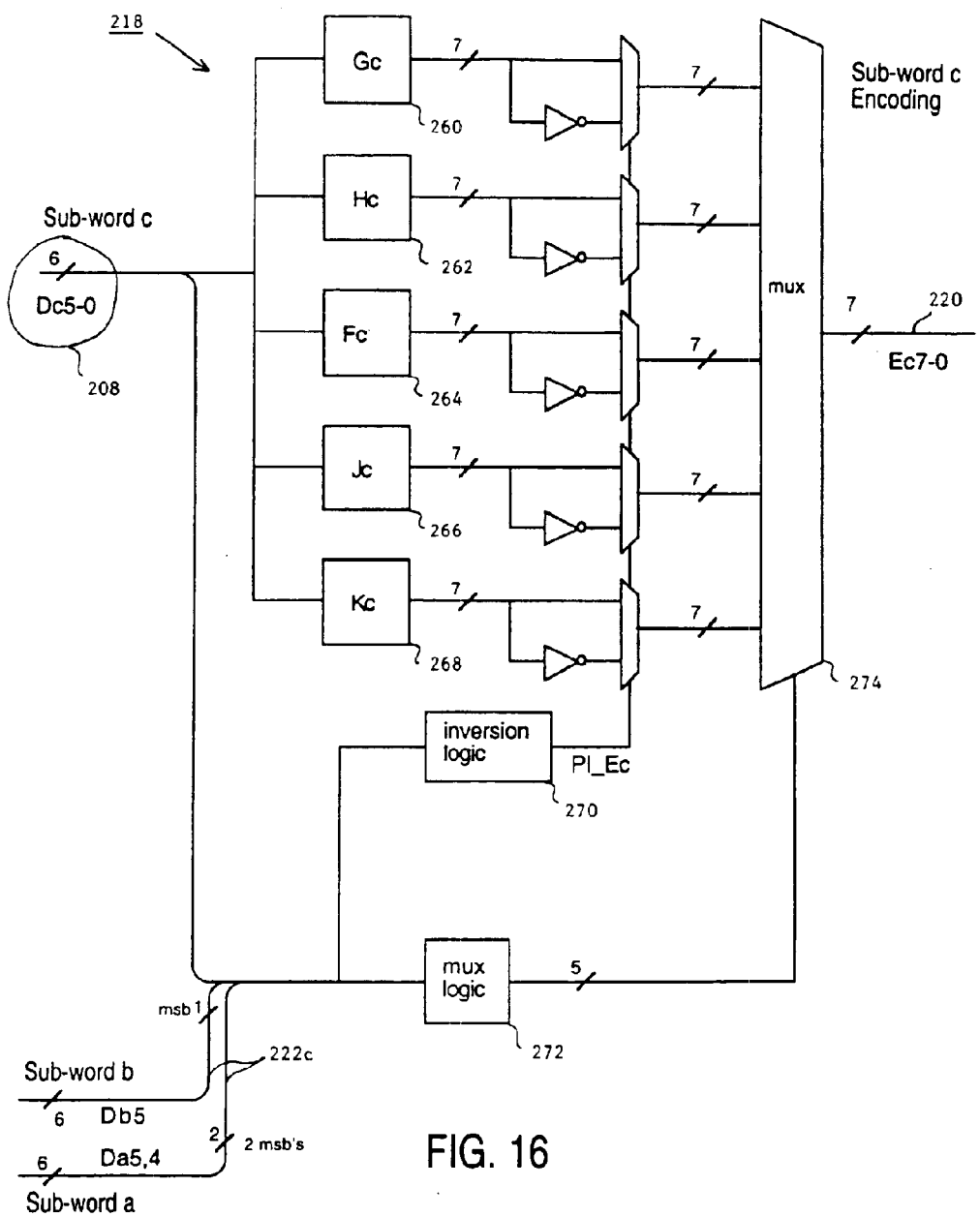
FIG. 16 is a further detail of the encoding applied to sub-word c according to the present invention.

FIG. 16 is a further detail of the encoding applied to sub-word c 208 by sub-word encoder 218 according to the present invention. With reference to FIG. 16, Sub-word c 208 is encoded in parallel by Gc encoder block 260, Hc encoder block 262, Fc 1, 2 encoder block 264, Jc encoder block 266, and Kc encoder block 268. Shared information 222c is used by mux logic 272 to signal mux 274 and inversion logic 270 to perform post inversion for the cases requiring alternate encoding. Mux 274 together with mux logic 272 selects the encoded sub-word from Gc encoder block 260, Hc encoder block 262, Fc1, 2 encoder block 264, Jc encoder block 266, or Kc encoder block 268 that is transmitted as encoded sub-word c 220.

Figure 17:
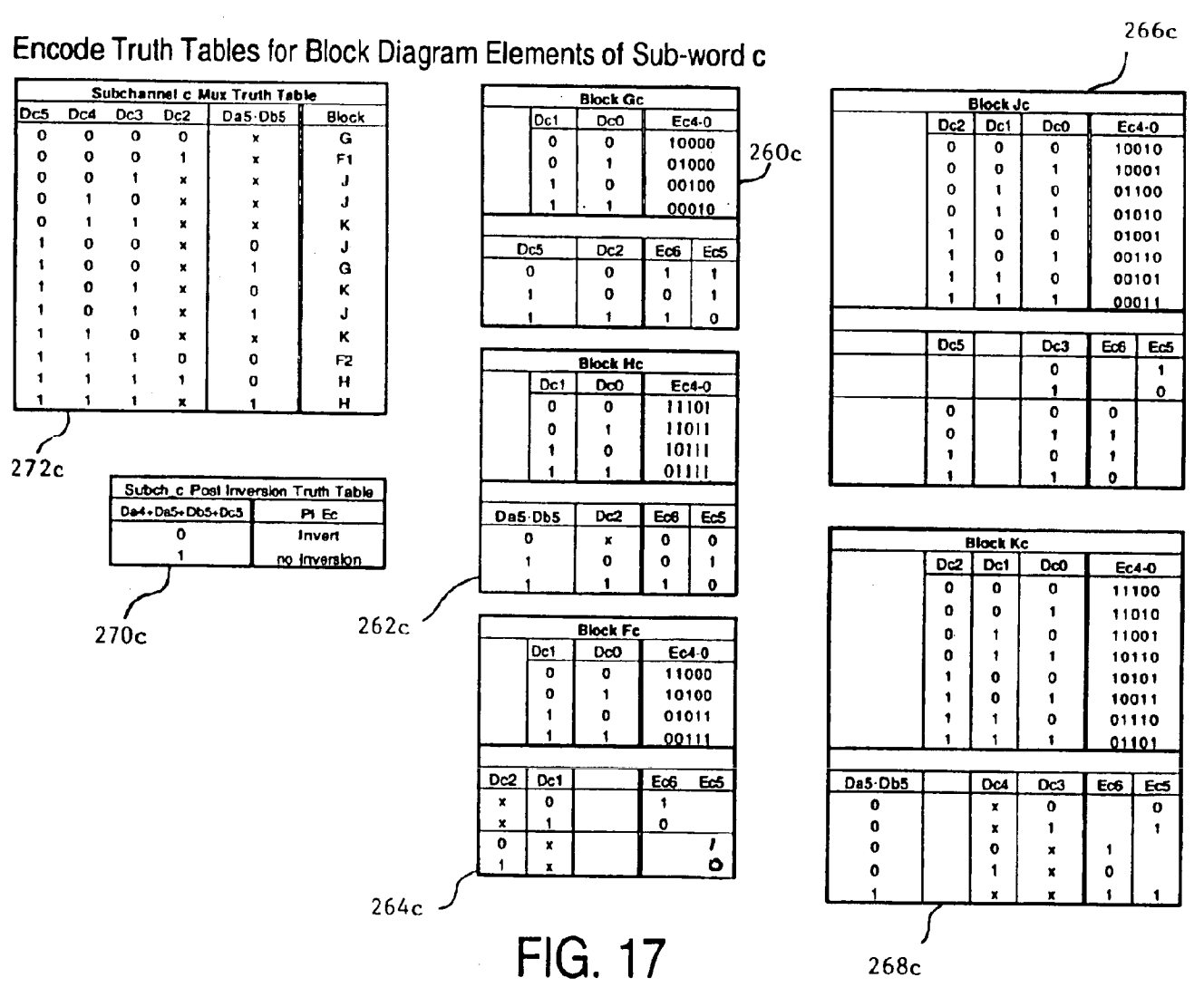

FIG. 17 shows the truth tables employed by the encoder blocks shown in FIG. 16. With reference to FIG. 17, mux truth table 272c displays the logic used by mux logic 270 (FIG. 16). Mux truth table 272c includes determination of the special cases requiring alternative encoding, the first MSB of each sub-word (Da5, Db5, Dc5) is considered in mux truth table 272c.

Gc truth table 260c is used by Gc encoder block 260 (FIG. 16). Hc truth table 262c is use by Hc encoder block 262 (FIG. 16) and Fc truth table 264c is used by encoder block Fc1, 2 264 (FIG. 16). These three truth tables employ the same mapping between the two LSBs of the data sub-word and the five LSBs of the encoded sub-word as was used for sub-word a encoder blocks and truth tables.

Jc truth table 266c is used by Jc encoder block 266 (FIG. 16) and Kc truth table 268c is used by Kc encoder block 268 (FIG. 16). These two truth tables employ the same mapping between the three LSBs of the data sub-word and the five LSBs of the encoded sub-word as was used for sub-word a encoder blocks and truth tables.

Inversion logic truth-table 270c is used by inversion logic 270 (FIG. 16) to invert encoded sub-word c 220 when alternate encoding is performed. It will be appreciated by those of skill in the art that post inversion may be performed after mux 274 (FIG. 16) as a particular application is considered. The present invention is not limited by the order of mux 274 and the inversion of encoded sub-word c 220.

Figure 18:
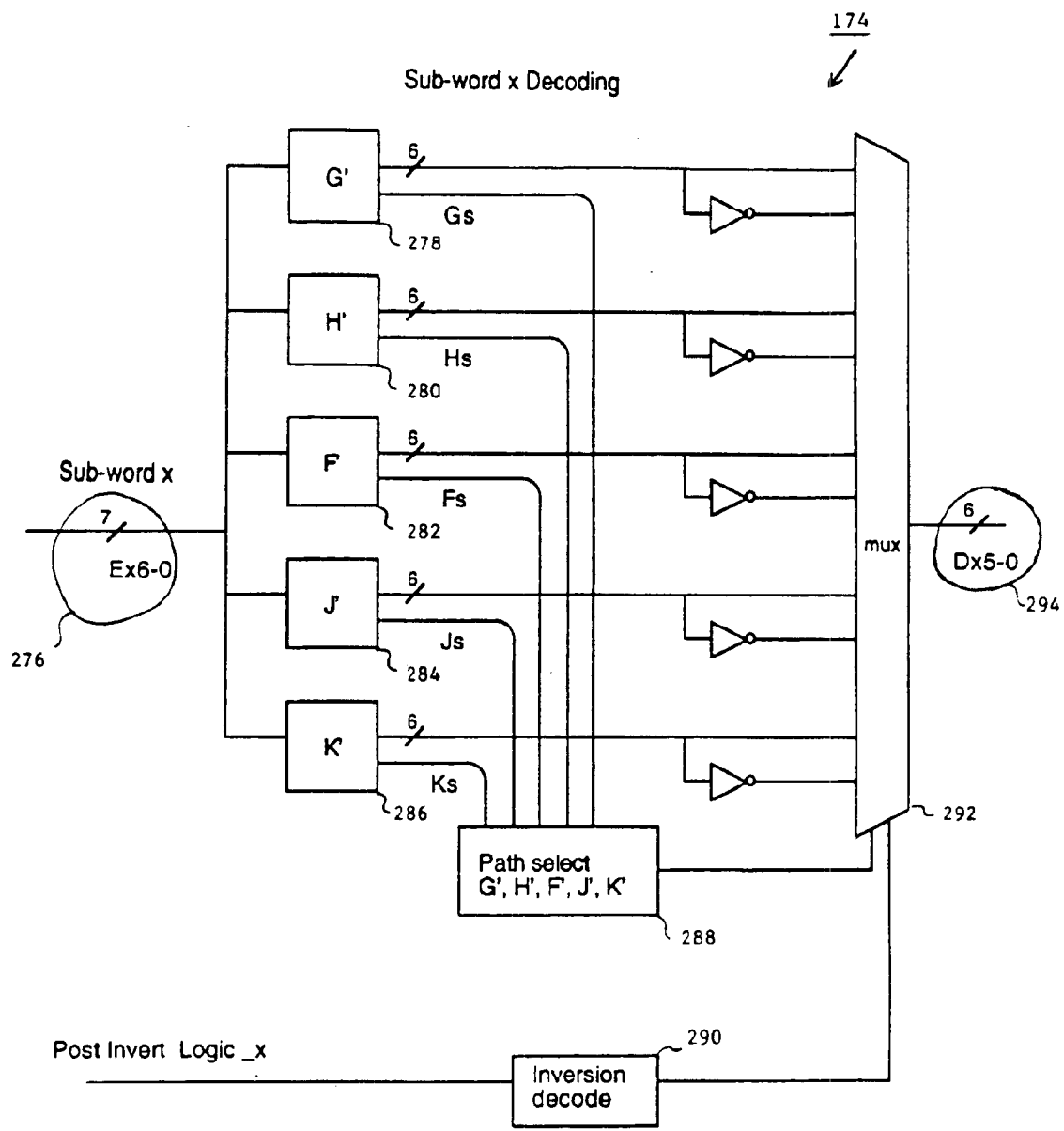
FIG. 18 is a detail of the decoding applied to a generic sub-word x, where x refers to sub-word a, b, and c.

FIG. 18 is a detail of the decoding applied to a generic sub-word x, where x refers to sub-word a, b, and c. It will be appreciated that the advantage taken of the similarity existing across sub-word encoding is also taken during encoded sub-word decoding. The five LSBs rendered by each encoder block (i.e., Ga encoder block 228, Ha encoder block 230, Fa encoder block 232, Ja encoder block 234, and Ka encoder block 236 (FIG. 12), that are used in each sub-word, are unique. This property is used for designing the decoding logic.

Decoder 174 (FIG. 8) is shown in greater detail in FIG. 18. With reference to FIG. 18, when a valid five LSB line state is detected on one of the decoder blocks (G' decode block 278, H' decode block 280, F' decode block 282, J' decode block 284, or K' decode block 286) it will be the only valid input line state over all decoder blocks. Detection of this valid input line state drives decode mux 292 which selects the decode block that produced the valid line state.

FIG. 19 shows the truth tables employed by the decoder blocks shown in FIG. 18 for encoded sub-word (x=a) 276. With reference to FIG. 19, reverse truth tables are created for decoding, G' decode truth table 278a is used to decode the encoding performed by Ga encode truth table 228a (FIG. 13). H' decode truth table 280a is used to decode the encoding performed by Ha encode truth table 230a (FIG. 13). F' decode truth table 282a is used to decode the encoding performed by Fa encode truth table 232a (FIG. 13). J' decode truth table 284a is used to decode the encoding performed by Ja encode truth table 234a (FIG. 13). K' decode truth table 286a is used to decode the encoding performed by Ka encode truth table 236a (FIG. 13). In a similar way decode truth tables are created for sub-words b and c based on the corresponding encoding truth tables.

The conventions used in sub-word a decode truth table 296 (FIG. 19), sub-word b decode truth table 298 (FIG. 20), and sub-word c decode truth table 300 (FIG. 21) are as follows:

A·B Both A and B are true;

A+B either A or B or both A and B are true;

xor Only A or B are true, but not both A and B are true;

A__ Invert the value of A.

Returning to the example above, where mux 292 (FIG. 18) selected the appropriate decode block, for the given unique line state, the decoded sub-word is determined from the corresponding truth table entries using the conventions previously listed.

For example, if the valid line state caused mux 292 (FIG. 18) to select the first entry in G' decode truth table 278a, the decoded value returned would be "0 0 0 Ea5__0 0," where Ea5__ indicates the inverse of the encoded bit.

The code mappings are chosen such that there is symmetry with respect to inversion. An encoded sub-word can be decoded as described or if the encoded sub-word is inverted it can be decoded as described and then inverted and the correct decoded sub-word will be obtained. Thus, "invert-decode-invert" yields the same result as "decode."

With reference to FIG. 19, inversion logic 290a inverts decoded sub-word (x=a) 294 (FIG. 18) when the weight of encoded sub-word c 220 (FIG. 16) equals five by signaling invert decoded result 290 (FIG. 18).

FIG. 20 shows the truth tables employed by the decoder blocks shown in FIG. 18 for encoded sub-word b (x=b) 276. With reference to FIG. 20, reverse truth tables are created for decoding, G' decode truth table 278b is used to decode the encoding performed by Gb encode truth table 244b (FIG. 15). H' decode truth table 280b is used to decode the encoding performed by Hb encode truth table 246b (FIG. 15). F' decode truth table 282b is used to decode the encoding performed by Fb encode truth table 248b (FIG. 15). J' decode truth table 284b is used to decode the encoding performed by Jb encode truth table 250b (FIG. 15). K' decode truth table 286b is used to decode the encoding performed by Kb encode truth table 252b (FIG. 15).

Inversion logic 290b inverts decoded sub-word (x=b) 294 (FIG. 18) when the weight of encoded sub-word c 220 (FIG. 16) equals five or if the weight of sub-word a 212 (FIG. 12) equals two.

FIG. 21 shows the truth tables employed by the decoder blocks shown in FIG. 18 for encoded sub-word (x=c) 276. In a similar way decode truth tables are created for sub-word c based on the corresponding encoding truth tables. With reference to FIG. 21, reverse truth tables are created for decoding, G' decode truth table 278c is used to decode the encoding performed by Gc encode truth table 260c (FIG. 17). H' decode truth table 280c is used to decode the encoding performed by Hc encode truth table 262c (FIG. 17). F' decode truth table 282c is used to decode the encoding performed by Fc encode truth table 264c (FIG. 17) J' decode truth table 284c is used to decode the encoding performed by Jc encode truth table 266c (FIG. 17). K' decode truth table 286c is used to decode the encoding performed by Kc encode truth table 268c (FIG. 17).

Inversion logic 290c inverts decoded sub-word (x=c) 294 (FIG. 18) when the weight of encoded sub-word a 212 (FIG. 12) equals two.

FIG. 22 is an alternative embodiment for encoding binary numbers, with reference to FIG. 22, binomial coefficient matrix encoding 302 displays the results of binomial encoding, comparing decimal value 304, binary value 306, and encoded value 308 for integer numbers ranging from zero to 19.

Figure 23:
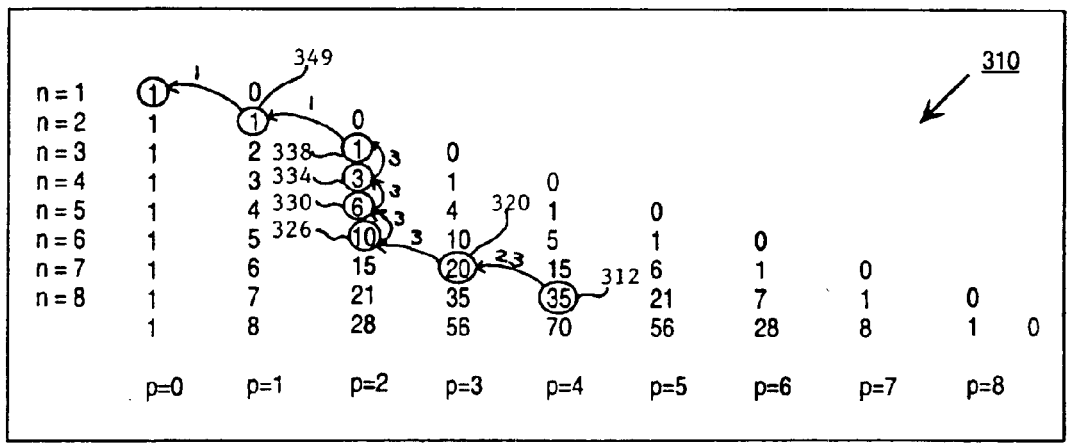
FIG. 23 is an example of binomial coefficient matrix encoding for the decimal value 58.

FIG. 23 is an alternative embodiment of encoding binary numbers using the principle of binomial expansion. With reference to 310 of FIG. 23, the following recurrence relation hold true for all binomial coefficients.

$$(n)_p = (n-1)_p + (n-1)_{p-1}.$$

n is the length of the encoded codeword and p is the number of ones in the encoded codeword. The recurrence relation partitions the span of an n-bit codeword weight p into two contiguous sub-ranges. The codebook interpretation is the following. The first sub-range are those codewords that have a zero in the nth bit position and p ones in the remaining n−1 bit positions. There are $(n-1)_p$ such codewords in the n-bit codeword of constant weight p ones in the remaining n−1 bit position. There are $(n-1)_p$ such codewords in the n-bit codeword of constant weight p. The second range defines those codewords that have a one in the nth bit $n^{th}$ position and p−1 ones in the remaining n−1 bit positions. There are $(n-1)_{p-1}$ of these codewords in the n bit codeword of constant weight p.

To convert the information content of a binary number to an n-bit codeword of constant weight p, the binary number is compared to $(n-1)_p$. If it is smaller, then the $n^{th}$ bit is set to zero. If it is greater, then the nth bit is set to one. The procedure is applied recursively with three restrictions.

1. For the case where the $n^{th}$ bit is set to one, the original binary number must be numerically adjusted downward into a number range for which it can be computed as an n−1 bit codeword of constant weight p−1. This numerical adjustment is done by subtracting $(n-1)_p$.

2. The algorithm does not work for the all-zero binary codeword. To compensate, all binary numbers can be increased by one, or the all-zero codeword can be mapped to an unused binary value such as $(n)_{p+1}$.

3. 35 $(n)_0$ equal one for any non-negative integer value of n.

4. $(n)_p$ equals zero when p is larger than p.

To speed up the conversion process, it is desirable to pre-compute the binomial coefficients and store them in a table or codebook such as the one shown in 310 of FIG. 23. To encode the 6 bit binary number 57 into an 8-bit constant-weight code of weight four, the process is as follows.

The first step is to compare 58 to $(7)_4$ which is found in the table of FIG. 23 at 312 and returns the numerical value 35. The first bit is then set to one and the algorithm is applied recursive by comparing 58−35+23 to $(6)_3$. Note that the original number 58 is down shifted to 23, and the codeword length and number of ones remaining in the codeword are both reduced by one.

The value of $(6)_3$ is looked up in the codebook at 320. The numerical value is 20. The second bit is then set to one and the algorithm is applied recursive by comparing 23−20=3 to $(5)_2$. The next three recursion are for $(5)_2$, $(4)_2$, and $(3)_2$, found at locations 326, 330, and 334 in the codebook. For each recursion, the values are larger than 3, so the next three bits are all zero. For $(2)_2$ at 338 in the codebook, the value is 1 which is less than 3. The new number is 3−1=2, the codeword length and the number of ones remaining in the codeword are reduced by one and the sixth bit is set to one. The next value to compare is (1), at 349 which is greater than 2. The new number is 2−1=1, the codeword length and the number of ones remaining in the codeword are reduced by one, and the seventh bit is set to one. The next value to compare is (0), which is equal than 1. The eighth bit is set to zero and the algorithm stops. The conversion of the numerical value 58 results in a codeword of 11000110 as shown in 310b of FIG. 23. Note that this value equals the sum of the codebook entries when the number was greater than the codebook entry,

11000110=$(7)_4+(6)_3+(2)_2+(1)_1$=35+20+2+1=58.

Signal Line Termination

Referring back to FIG. 9, in the embodiment shown therein, four encoded data lines are terminated into the receive device 182. A terminating potential ($V_{TERM}$) and a reference potential ($V_{REF}$) can be generated that are optimized over the system to minimize the bit rate error. In one embodiment, $V_{TERM}$ is regulated by a voltage regulator connected between a termination node and a system potential reference plane, which is typically system ground or Vss. The voltage regulator continuously adjusts the reference potential that will be used by the signal line input buffers to minimize the current flow into and out of the termination node of the signal lines. It will be appreciated by those of skill in the art that creating a $V_{REF}$ that tracks with the fluctuations in the signals themselves is equivalent to $V_{REF}$ slicing the data eye of the signals in the middle of their peak to peak excursions, thereby creating an equivalent area above and below the middle of the data eye.

In the figures described in this detailed description of the invention, the invention is described with the aid of schematic diagrams of circuits showing discrete components such as amplifiers, input buffers, current sensors, voltage regulators, etc. These figures have been prepared for clarity. It will be apparent to those of ordinary skill in the art that equivalent manipulation of the signals can be obtained by integrated circuits such as an application specific integrated circuits (ASIC). An ASIC can be built using various technologies such low voltage or high voltage complimentary metal oxide semiconductor (CMOS). For example, standards such as low voltage differential signaling (LVDS) can be used for an interface design using CMOS gates for the input buffers. The present invention is not limited by implementation methods such as a circuit with discrete components or embodiment within an integrated circuit (IC) or ASIC.

Figure 24:
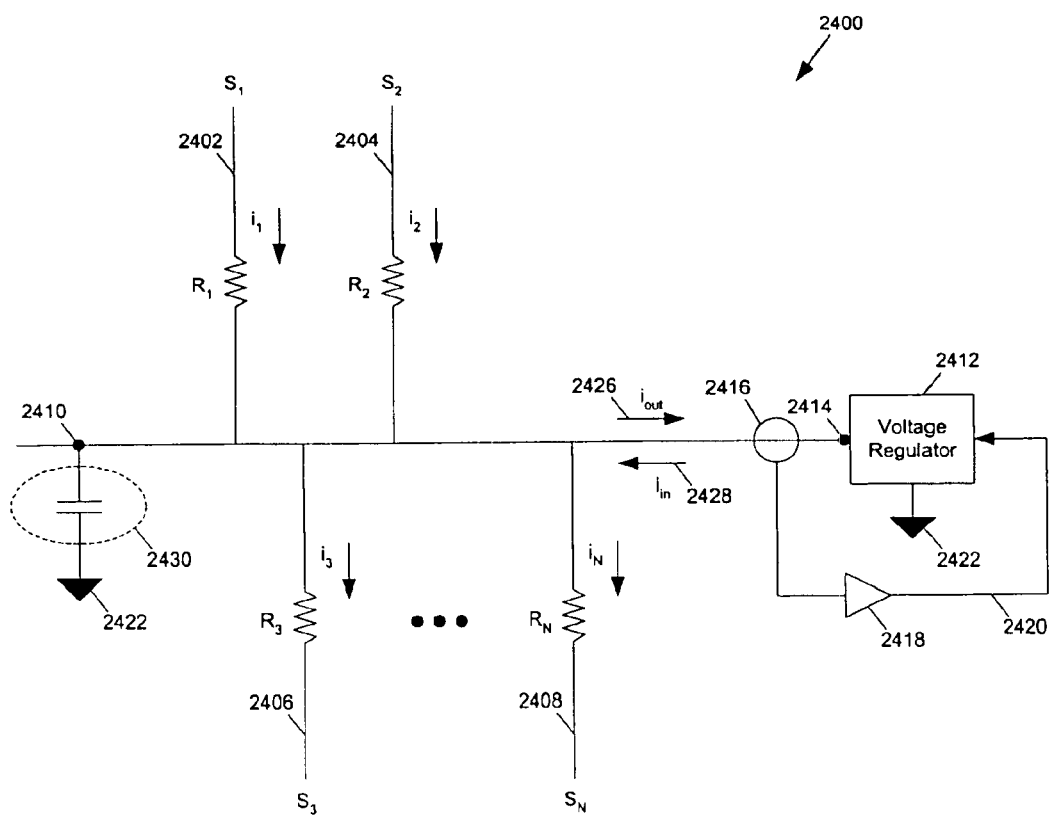
FIG. 24 is a schematic of a voltage regulator coupled with N signal lines.

FIG. 24 illustrates a schematic representation, at 2400, of a voltage regulator coupled with N signal lines. With reference to FIG. 24, single ended signal lines $S_1$ at 2402, $S_2$ at 2404, $S_3$ at 2406, up to $S_N$ at 2408 are terminated into a termination node 2410. There can be a general number of N signal lines connected to the termination node 2410 as indicated by dots between $S_3$ (2406) and $S_N$ (2408). In one embodiment, current flows into the termination node when a data bit is high, e.g. in a "1" state and current flows out of the termination node when a data bit is low, e.g. in a "0" state. If a sum of currents into the termination node 2410 from signal lines sourcing current does not equal a sum of currents out of the termination node into signal lines sinking current then a current is sensed by a current sensor 2416. In one embodiment, the current sensor 2416 can be a resistor such as a one-ohm resistor with a voltage variation measured across the resistor. The output of the current sensor is input to a differential-to-single-ended operational amplifier 2418. The output, 2420, of the operational amplifier 2418 is a voltage referenced to a system potential reference 2422 and is used as a reference for a voltage regulator 2412. The voltage regulator 2412 is connected to termination node 2410 and 2422. The current sensor 2416 monitors a current flowing into and out of the termination node 2410. The voltage regulator is adjusted until the current monitored by the current sensor 2416 is equal to zero.

In one embodiment, a negative feedback loop can be used to drive the current sensed by current sensor 2416 to zero. Accordingly, if the current is flowing out of the termination node, as indicated by 2426, an output voltage of the voltage regulator is increased at the voltage regulator output 2414. Conversely, if current is flowing into the termination node, as indicated by 2428, the output voltage is increased at the voltage regulator output 2414. In this embodiment, the voltage regulator 2412 acts as a voltage source to drive the current flow to zero.

Typically, the voltage regulator will be tracking current fluctuations occurring over multiple bit intervals. Therefore the response time of 2418 will need to be at least as fast as the current variations presented by these multi-bit length time scales. High frequency fluctuations creating noise on 2410 can be eliminated by optional filtering 2430. An example of optional filtering is a capacitor connected between 2410 and 2422. A source of high frequency voltage fluctuations can occur when the signal lines are not the same length. Often the practical requirements of circuit design necessitate signal line length mismatch. Such mismatch will cause a charge to build up because equal numbers of lines are not sourcing and sinking current simultaneously as would be the case for an ideal system propagating balanced signals.

In one non-limiting example, of an embodiment of the invention, a tenth of an inch variation in line signal length can correspond to a signal mismatch duration of ten picoseconds. Signal lines $S_1$ through $S_N$ typically have a characteristic impedance of 40–60 ohms and are terminated in a load resistor of a similar value. Thus, in one example, the signal lines will be terminated in 50 ohm loads and a 20 milliamp current will flow on each line. This condition gives rise to an undesired voltage swing on the termination node when signal lines do not switch at the same time (e.g. during the 20 picosecond mismatch period). Capacitance is added at 2430 to reduce the voltage swing to an acceptable level. The value of the capacitance used will depend on a particular system design taking into consideration the number of lines and a magnitude of an acceptable voltage swing as well as whether the invention was being implemented inside an ASIC. Thus, in a non-limiting example, capacitance values can range from 100 picofarads to 1 microfarad in different embodiments of the invention. The voltage regulator bandwidth will range from 1 megahertz to hundreds of megahertz depending on the particular design under consideration.

Figure 25:
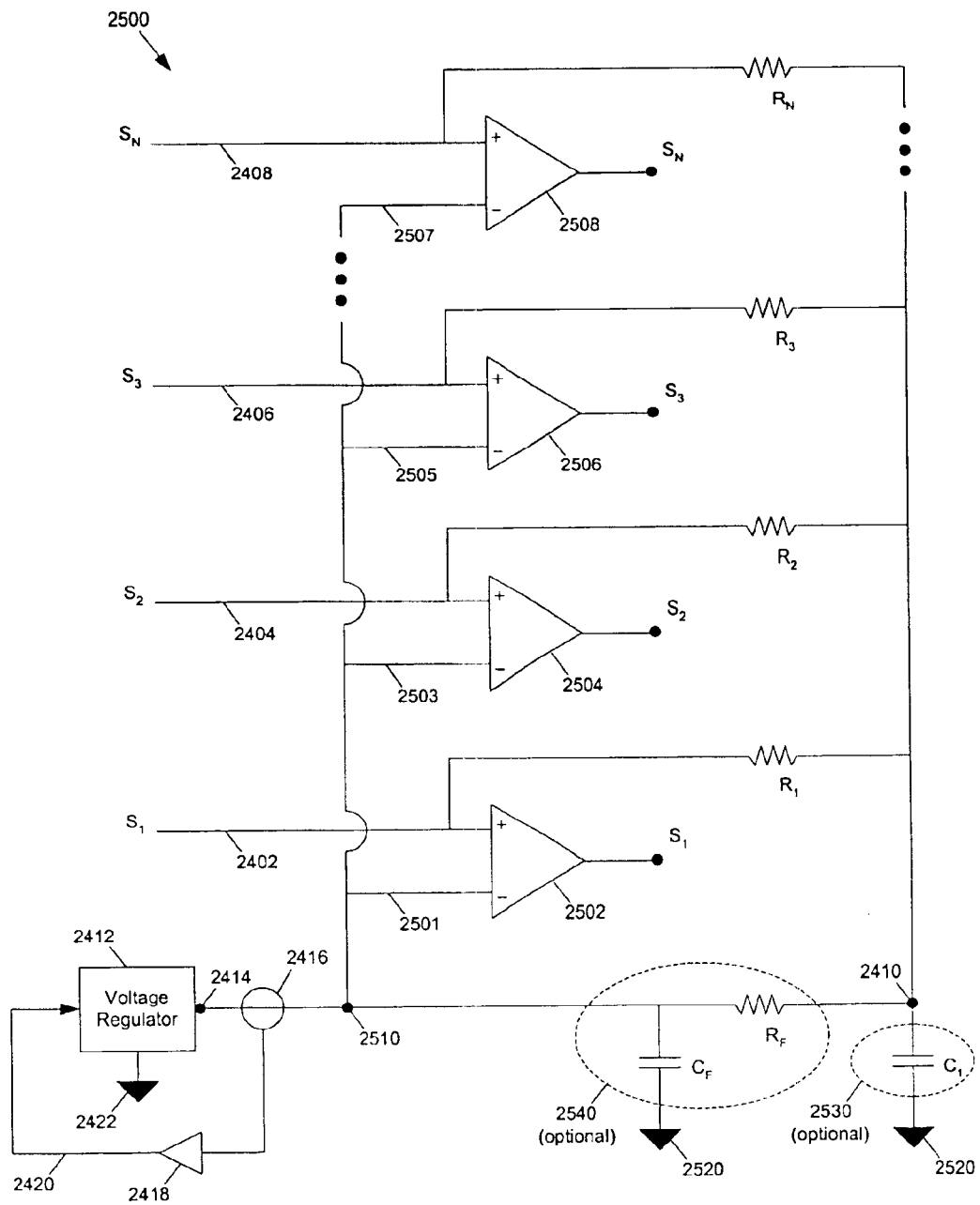
FIG. 25 is a schematic of a termination circuit using a termination potential as a reference potential for signal line input buffers.

One embodiment of the invention is shown in FIG. 25. FIG. 25 is a schematic of a termination circuit using a termination potential as a reference potential for signal line input buffers. With reference to FIG. 25, a termination potential, $V_{TERM}$, indicated by 2410 is used as a reference potential, $V_{REF}$, at 2510 for N differential input buffers 2502, 2504, 2506, and 2508. Each differential input buffer receives a single ended signal and is supplied a reference potential. For example, signal $S_1$, indicated at 2402, is input to input buffer 2502 and the reference potential is supplied at 2501. Similarly, signal $S_2$, indicated at 2404, is input to input buffer 2504 and the reference potential is supplied at 2503. Signal $S_3$, indicated at 2406, is input to input buffer 2506, the reference potential is supplied at 2505 and signal $S_N$ is input to input buffer 2508 with the reference potential supplied at 2507. The signals, $S_1$, $S_2$, $S_3$, through $S_N$ are connected to their respective load resistors and are connected to a termination node 2410.

As previously described in conjunction with FIG. 24, the current sensor 2416 detects current flow into or out of 2510. The output of the current sensor is fed to the voltage regulator 2412 as a reference from which the output of the voltage regulator 2414 is adjusted in order to drive the current flow into or out of 2510 to zero. An optional filter can be connected to 2410 as shown at 2530 to reduce undesirable noise fluctuations, such as high frequency fluctuations, described previously in conjunction with FIG. 24. Optional filter 2540 can also be inserted as shown between 2510, 2520, and 2410 to filter the signal being used for the reference potential at 2510. Potential reference 2520 and 2422 can be at the same potential such as system ground.

Figure 26:
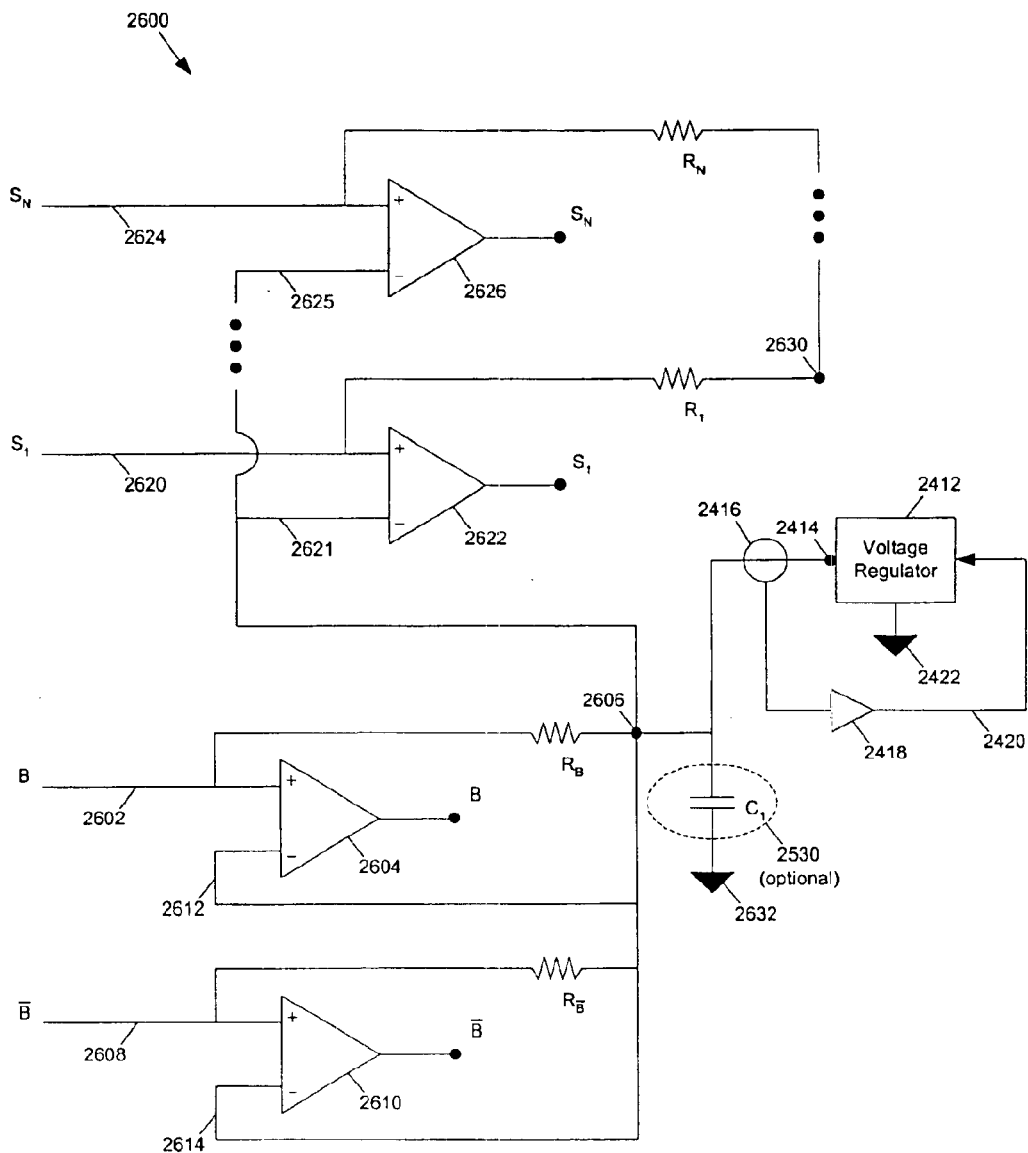
FIG. 26 illustrates using a termination potential from a complimentary pair as a reference potential for N signal lines.

Another embodiment of the invention is shown in FIG. 26. FIG. 26 illustrates using a termination potential from a balanced signal, complimentary pair, as a reference potential for N signal lines. Two of the signal lines from FIG. 25, for example $S_1$ (2402) and $S_2$ (2404) can be sent as a balanced signal 2602 (FIG. 26) and a compliment of the balanced signal 2608 (FIG. 26) to form a termination potential at termination node 2606. Signal lines $S_1$ (2620) through $S_N$ (2624) use the termination potential from 2606 as a reference potential at the reference inputs to the signal line buffers. Thus, reference inputs 2621 and 2625 receive the termination potential created at 2606 as the reference potential for the signals output from input buffers 2622 through 2626. The output of the voltage regulator 2414 is connected with 2606 to drive the current flow into and out of node 2606 to zero.

Optional filter 2530 (e.g., capacitor C₁) can be used between termination node 2606 and system reference potential 2632 as described previously in conjunction with FIG. 24. Optional filter 2530 may be used to remove noises due to high frequency fluctuations (e.g., caused by mismatch in signal line length), improving the reference voltage created at 2606 for input buffers 2622 through 2626. Potential reference 2632 and 2422 can be at the same potential such as system ground. Further, in one embodiment, an additional optional filter (e.g., a capacitor, not shown in FIG. 26) is used to remove high frequency noises from the voltage at node 2630 for a more accurate termination.

Figure 27:
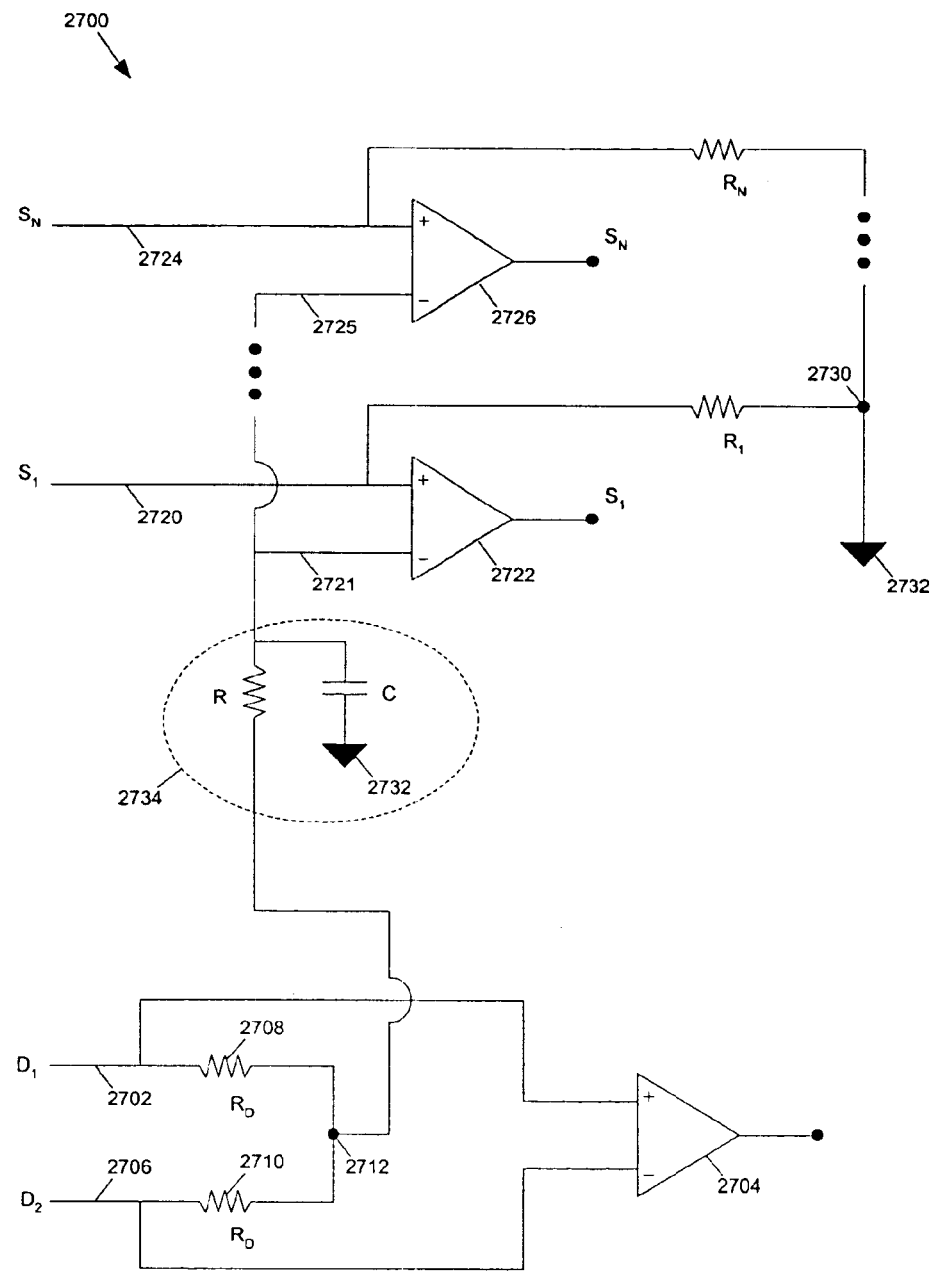
FIG. 27 illustrates using a termination potential from a differential pair as a reference potential for N signal lines.

In another embodiment of the invention, two signal lines can be a differential pair, such as the differential pair including signal lines 2702 and 2706 as shown in FIG. 27. In one embodiment, the differential pair can carry a balanced signal. FIG. 27 illustrates using a termination potential from a differential pair as a reference potential for N signal lines. With reference to FIG. 27, the differential pair (2702 and 2706) is terminated in a bridge tied load as indicated by termination resistors 2708 and 2710. A termination potential exists at a node 2712 and is supplied as the reference potential to input buffer 2722 at 2721 and to input buffer 2726 at 2725. Optionally, the voltage regulator can be used to filter the reference signal input at 2721 and 2725 as described previously in FIGS. 24 through 26.

Figure 28:
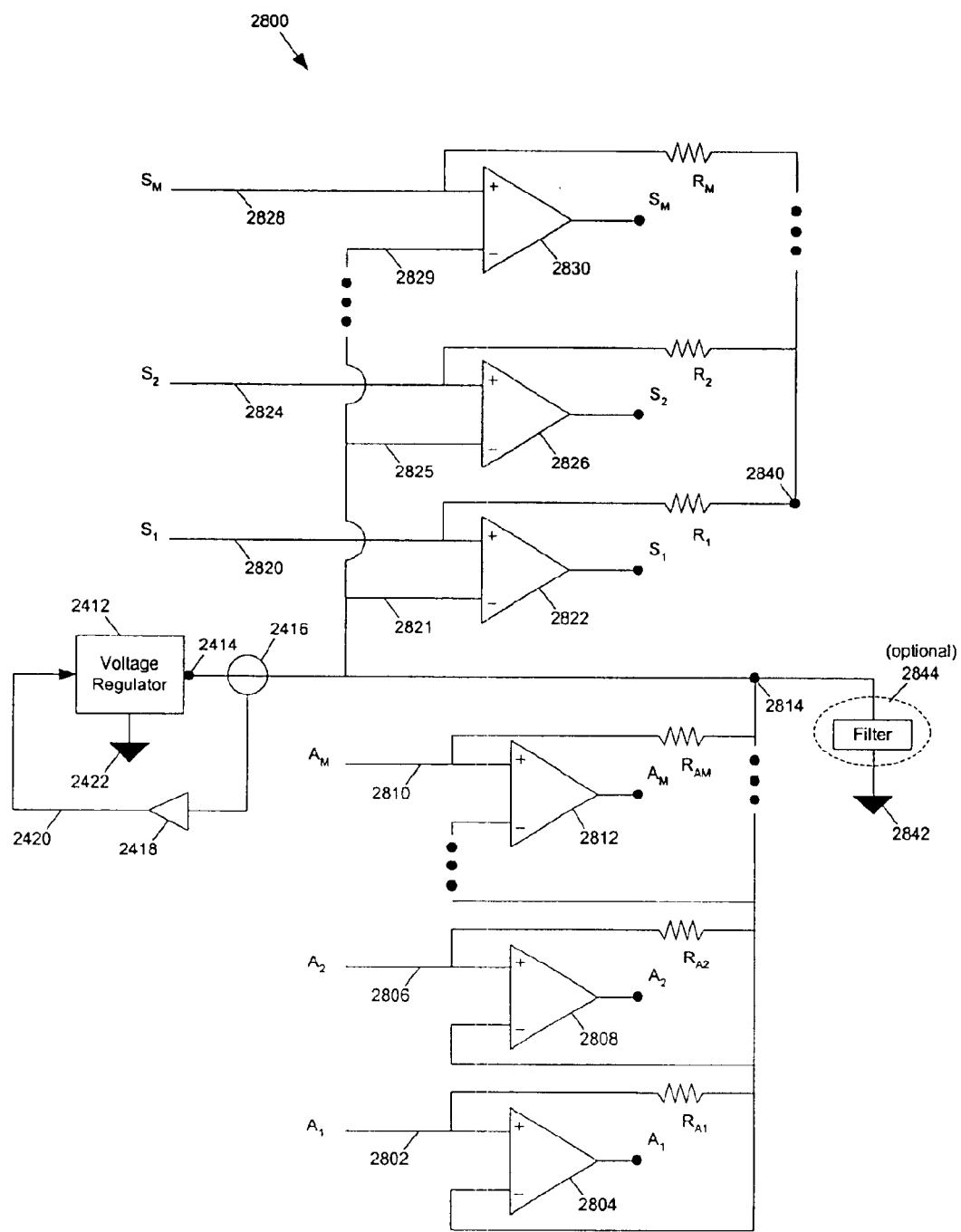
FIG. 28 illustrates using a termination potential from M balanced signal lines as a reference potential for N signal lines.

In another embodiment of the invention, FIG. 28 illustrates using a termination potential from signals that are balanced over M lines or M balanced lines as a reference potential for N signal lines. With reference to FIG. 28, M single-ended signal lines 2802, 2806, and 2810 are terminated at termination node 2814. The termination potential existing at node 2814 is used as the reference potential for signal input buffers 2804, 2808, and 2812. M signal lines, represented by 2820, 2824, and 2828 are input to input buffers 2822, 2826, and 2830 respectively. The termination potential at 2814 is supplied as the reference potential to input buffers 2822, 2826, and 2830 at 2821, 2825, and 2829 respectively.

The reference potential, input to input buffers 2822, 2826, and 2830 can be filtered by the voltage regulator 2412 to minimize the current flow into and out of node 2814 according to the previous discussion of the voltage regulator given in conjunction with FIGS. 24 through 27. Similarly, optional filtering (e.g., a capacitor) can be used as shown at 2844 between 2814 and system reference potential 2842 to remove high frequency noises from the reference voltage for buffers 2822, 2826, and 2830 at 2821, 2825, and 2829 respectively. Further, in one embodiment, an additional optional filter (e.g., a capacitor, not shown in FIG. 28) is used to stabilize the voltage at node 2840 to maintain the termination voltage for a more accurate termination.

It will be appreciated that the methods described in conjunction with the figures may be embodied in machine-executable instructions, e.g. software. The instructions can be used to cause a general-purpose or special-purpose processor that is programmed with the instructions to perform the operations described. Alternatively, the operations might be performed by specific hardware components that contain hardwired logic for performing the operations, or by any combination of programmed computer components and custom hardware components. The methods may be provided as a computer program product that may include a machine-readable medium having stored thereon instructions, which may be used to program a computer (or other electronic devices) to perform the methods. For the purposes of this specification, the terms "machine-readable medium" shall be taken to include any medium that is capable of storing or encoding a sequence of instructions for execution by the machine and that cause the machine to perform any one of the methodologies of the present invention. The term "machine-readable medium" shall accordingly be taken to included, but not be limited to, solid-state memories, optical and magnetic disks, and carrier wave signals. Furthermore, it is common in the art to speak of software, in one form or another (e.g., program, procedure, process, application, module, logic . . . ), as taking an action or causing a result. Such expressions are merely a shorthand way of saying that execution of the software by a computer causes the processor of the computer to perform an action or produce a result.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A method for signal line termination, the method comprising:

sensing a current flowing through a termination node which terminates a plurality of signal lines; and adjusting a voltage at the termination node to reduce a magnitude of the current.

2. A method as in claim 1, wherein a voltage regulator adjusts the voltage based on the current that is sensed.

3. A method as in claim 2, wherein the voltage regulator increases the voltage when the current is flowing out of the termination node from the signal lines; and, the voltage regulator decreases the voltage when the current is flowing into the termination node into the signal lines.

4. A method as in claim 1, wherein signals transmitted on the plurality of signal lines are substantially balanced.

5. A method as in claim 4, wherein the plurality of signal lines comprises a pair of differential signals.

6. A method as in claim 4, wherein an average of less than two lines are used to transmit each bit of information in the plurality of signal lines.

7. A method as in claim 1, wherein the current results from terminating a first signal line carrying a balanced signal and a second signal line carrying a compliment of the balanced signal.

8. A method as in claim 1, wherein the magnitude of the current is reduced to a level that is substantially zero.

9. A method as in claim 1, further comprising:

filtering a high frequency component on the termination node.

10. A method as in claim 9, wherein the high frequency component is filtered relative to ground.

11. A method as in claim 1, wherein the voltage at the termination node provides a reference to each of a plurality of buffers to receive the plurality of signals respectively.

12. An apparatus for signal line termination, the apparatus comprising:

a termination node to terminate a plurality of signal lines;

a current sensor coupled to the termination node, the current sensor determining a current flowing through a termination node; and a voltage regulator coupled with the termination node and the current sensor, the voltage regulator adjusting a voltage at the termination node to reduce a magnitude of the current.

13. An apparatus as in claim 12, wherein the voltage regulator adjusts the voltage based on feedback from the current sensor.

14. An apparatus as in claim 13, wherein the voltage regulator increases the voltage when the current is flowing out of the termination node from the signal lines; and, the voltage regulator decreases the voltage when the current is flowing into the termination node into the signal lines.

15. An apparatus as in claim 12, wherein signals transmitted on the plurality of signal lines are substantially balanced.

16. An apparatus as in claim 15, wherein the plurality of signal lines comprises a pair of differential signals.

17. An apparatus as in claim 15, wherein an average of less than two lines are used to transmit each bit of information in the plurality of signal lines.

18. An apparatus as in claim 12, wherein the current results from terminating a first signal line carrying a balanced signal and a second signal line carrying a compliment of the balanced signal.

19. An apparatus as in claim 12, wherein the magnitude of the current is reduced to a level that is substantially zero.

20. An apparatus as in claim 12, further comprising:
a filter coupled to the terminal node, the filter filtering a high frequency component on the termination node.

21. An apparatus as in claim 20, wherein the high frequency component is filtered relative to ground.

22. An apparatus as in claim 12, further comprising:
a plurality of buffers to receive the plurality of signals respectively;
wherein the voltage at the termination node provides a reference to each of the plurality of buffers.

23. A circuit for signal line termination, the circuit comprising:
means for sensing a current flowing through a termination node which terminates a plurality of signal lines; and
means for adjusting a voltage at the termination node to reduce a magnitude of the current.

24. A circuit as in claim 23, wherein said means for adjusting comprises a voltage regulator to adjust the voltage based on an output of said means for sensing.

25. A circuit as in claim 24, wherein the voltage regulator increases the voltage when the current is flowing out of the termination node from the signal lines; and, the voltage regulator decreases the voltage when the current is flowing into the termination node into the signal lines.

26. A circuit as in claim 23, wherein signals transmitted on the plurality of signal lines are substantially balanced.

27. A circuit as in claim 26, wherein the plurality of signal lines comprises a pair of differential signals.

28. A circuit as in claim 26, wherein an average of less than two lines are used to transmit each bit of information in the plurality of signal lines.

29. A circuit as in claim 23, wherein the current results from terminating a first signal line carrying a balanced signal and a second signal line carrying a compliment of the balanced signal.

30. A circuit as in claim 23, wherein the magnitude of the current is reduced to a level that is substantially zero.

31. A circuit as in claim 23, further comprising:
filtering a high frequency component on the termination node.

32. A circuit as in claim 31, wherein the high frequency component is filtered relative to ground.

33. A circuit as in claim 23, wherein the voltage at the termination node provides a reference to each of a plurality of buffers to receive the plurality of signals respectively.

34. An apparatus, comprising:
a first input buffer;
a first signal line termination;
a first signal line coupled with said first input buffer and said first signal line termination, said first signal line to receive a first signal;
a second input buffer;
a second signal line termination;
a second signal line coupled with said second input buffer and said second signal line termination, said second signal line to receive a second signal;
a first termination node coupled with said first signal line termination and said second signal line termination, said first termination code having a termination potential, said termination potential providing as a reference potential to said first input buffer and said second input buffer;
a third input buffer;
a third signal line coupled with the third input buffer, said termination potential providing a reference potential to said third input buffer,
said third signal line to receive a third signal; and
a second termination node coupled to the third signal line.

35. An apparatus as in claim 34, further comprising:
a fourth input buffer, and
a fourth signal line coupled with the fourth input buffer and the second termination node, said termination potential providing a reference potential to said fourth input buffer to receive a fourth signal.

36. An apparatus as in claim 34, further comprising:
a voltage regulator coupled between said first termination node and a system potential reference, said voltage regulator having a first output coupled with said first termination node; and
a current sensor coupled to said first termination node, said current sensor having a second output coupled with said voltage regulator which adjusts the first output to reduce a current sensed by the current sensor.

37. An apparatus as in claim 36, wherein when said current is flowing out of said first termination node, the first output of said voltage regulator is increased; when said current is flowing into said first termination node, the first output of said voltage regulator is decreased; and, wherein said current is reduced to a level that is substantially zero.

38. An apparatus as in claim 36, further comprising:
a filter connected between said second termination node and said system potential reference.

39. An apparatus as in claim 34, wherein said first signal is substantially balanced; and, said second signal is an inverse of said first signal.

40. An apparatus, comprising:
an input buffer;
a signal line termination;
a signal line coupled with said input buffer and said signal line termination, said signal line to receive a balanced signal;
a termination node coupled with said signal line termination, said termination node having a termination potential;
a reference node to provide a reference potential to said input buffer; and
a voltage regulator coupled between said reference node and a system potential reference, said voltage regulator having a first output coupled with said reference node; and a current sensor coupled to said reference node, said current sensor having a second output coupled with said voltage regulator which adjusts the first output to reduce a current sensed by the current sensor.

41. An apparatus as in claim 40, wherein when said current is flowing out of said reference node, the first output of said voltage regulator is increased; when said current is flowing into said reference node, the first output of said voltage regulator is decreased; and, wherein said current is reduced to a level that is substantially zero.

42. An apparatus as in claim 40, further comprising:

a filter connected between said reference node and said termination node.

43. An apparatus as in claim 40, further comprising:

a filter connected between said termination node and a system potential reference.

44. An apparatus, comprising:

a differential input buffer;

a differential signal line termination;

a differential signal line coupled with said differential input buffer and said differential signal line termination, said differential signal line to receive a pair of differential signal;

a reference node coupled with said differential signal line termination;

a first input buffer coupled with said reference node, said first input buffer receiving a reference potential from said reference node;

a first signal line termination;

a first signal line coupled with said first input buffer and said first signal line termination, said first signal line to receive a first signal; and wherein said first and second signal line terminations terminate at different nodes.

45. An apparatus as in claim 44 further comprising:

a voltage regulator coupled between said reference node and a system potential reference, said voltage regulator having a first output coupled with said reference node; and a current sensor coupled to said reference node, said current sensor having a second output coupled with said voltage regulator which adjusts the first output to reduce a current sensed by the current sensor.

46. An apparatus as in claim 44, wherein when said current is flowing out of said reference node, the first output of said voltage regulator is increased; when said current is flowing into said reference node, the first output of said voltage regulator is decreased; and, wherein said current is reduced to a level that is substantially zero.

47. An apparatus as in claim 44, further comprising:

a filter coupled between said differential signal line termination and a system potential reference.

* * * * *